United States Patent
Hiroyama et al.

(10) Patent No.: US 7,796,669 B2
(45) Date of Patent: Sep. 14, 2010

(54) SEMICONDUCTOR LASER DIODE

(75) Inventors: Ryoji Hiroyama, Kyo-tanabe (JP); Teruaki Miyake, Tottori (JP); Yuzuru Miyata, Yazu (JP)

(73) Assignee: Sanyo Electronic Co., Ltd., Osaka (JP)

( * ) Notice: Subject to any disclaimer, the term of this patent is extended or adjusted under 35 U.S.C. 154(b) by 399 days.

(21) Appl. No.: 11/525,088

(22) Filed: Sep. 22, 2006

(65) Prior Publication Data

US 2007/0069221 A1  Mar. 29, 2007

(30) Foreign Application Priority Data

Sep. 29, 2005  (JP)  ............................. 2005-283331
Aug. 28, 2006  (JP)  ............................. 2006-231132

(51) Int. Cl.
*H01S 5/00* (2006.01)
(52) U.S. Cl. ...................................... 372/68; 372/50.12
(58) Field of Classification Search .................. 257/94, 257/89; 372/50.121, 68
See application file for complete search history.

(56) References Cited

U.S. PATENT DOCUMENTS

| 2005/0058169 A1* | 3/2005 | Onishi ......................... 372/44 |
| 2005/0105577 A1 | 5/2005 | Fukuhisa et al. |
| 2006/0081872 A1* | 4/2006 | Onishi ........................ 257/103 |
| 2007/0019698 A1* | 1/2007 | Fukuhisa et al. ....... 372/50.121 |
| 2009/0086781 A1* | 4/2009 | Tanabe .................... 372/46.01 |

FOREIGN PATENT DOCUMENTS

| JP | 08-078725 | 3/1996 |
| JP | 11-017280 | 1/1999 |
| JP | 2001251015 | 9/2001 |
| JP | 2005-101099 | 4/2005 |
| JP | CN1617399 | 5/2005 |

OTHER PUBLICATIONS

Satoshi Arimoto et al., "Fundamental-Transverse-Mode Operation Of Window Laser Diode", IEEE Journal of Quantum Electronics, vol. 29, No. 6, Jun. 1, p. 1874-1877.
Chinese Office Action, English translation summary included, dated Aug. 21, 2009.

* cited by examiner

*Primary Examiner*—Howard Weiss
*Assistant Examiner*—Tifney L Skyles
(74) *Attorney, Agent, or Firm*—NDQ&M Watchstone LLP

(57) ABSTRACT

A semiconductor laser diode capable of further improving temperature characteristics while sufficiently preventing a laser beam emission end surface portion from thermal destruction through a window structure is obtained. This semiconductor laser diode comprises an active layer having a window structure on a laser beam emission end surface portion and a p-type layer, formed on the surface of the active layer, containing Mg and Zn as impurities. The impurity concentration of Zn contained in the p-type layer is larger than the impurity concentration of Mg contained in the p-type layer.

11 Claims, 17 Drawing Sheets

SEMICONDUCTOR LASER DIODE

BACKGROUND OF THE INVENTION

1. Field of the Invention

The present invention relates to a semiconductor laser diode and a method of fabricating the same, and more particularly, it relates to a semiconductor laser diode comprising a window structure on a laser beam emission end surface portion and a method of fabricating the same.

2. Description of the Background Art

In order to allow double-layer recording in a recordable DVD system, the intensity of a laser beam applied onto a disc must be increased. In order to improve the intensity of the laser beam applied onto the disk, the light output of a semiconductor laser diode serving as a light source must be increased.

In order to increase the output of the semiconductor laser diode, a COD (catastrophic optical damage: deterioration of a laser beam emission end surface portion) level must inevitably be improved. It is known that COD takes place in the following cycle: When a current is injected into an emission end surface portion having surface states in high concentration, non-radiative recombination takes place through these levels. Thus, the emission end surface portion generates heat. This heat reduces an energy gap of an active layer of the emission end surface portion, to increase light absorption. Thus, heat generation is further increased. The temperature of the emission end surface portion is increased due to this cycle to melt crystals, resulting in breakage of the emission end surface portion.

A semiconductor laser diode comprising a window structure formed by Zn diffusion is known in general as that suppressing such COD, as disclosed in "IEEE Journal of Quantum Electronics", Vol. 29, No. 6, pp. 1874 to 1877, 1993, for example. In the semiconductor laser diode comprising a window structure formed by Zn diffusion disclosed in this literature, an impurity (Zn) is introduced into an emission end surface portion of the semiconductor laser diode so that Zn introduced into the emission end surface portion of a p-type cladding layer is diffused to extrude toward an n-type cladding layer through an active layer, as clearly understood from Zn concentration profiles before and after the Zn diffusion in the conventional semiconductor laser diode shown in FIGS. 31 and 32 respectively. At this time, atoms constituting well layers and barrier layers of the active layer are mutually diffused to disorder a quantum well structure of the active layer. Thus, the band gap of the emission end surface portion of the active layer widens beyond those of the remaining regions, to reduce light absorption in the emission end surface portion. Thus, the emission end surface portion can be inhibited from temperature rise, thereby preventing from COD.

In a conventional AlGaInP-based red semiconductor laser diode, on the other hand, a band discontinuity value between an active layer and a p-type cladding layer on the side of a conduction band is so small that electrons supplied to the active layer easily thermally overflow from the active layer into the p-type cladding layer. Therefore, a light output value tends to lower with respect to the value of a fed current under a high temperature. Thus, it is disadvantageously difficult to improve temperature characteristics indexing unchangingness of the light output value with respect to the temperature. In order to improve the temperature characteristics by solving this disadvantage, the band discontinuity value between the active layer and the p-type cladding layer on the side of the conduction band must be increased by increasing the carrier (hole) concentration in the p-type cladding layer. In the conventional red semiconductor laser diode, the carrier (hole) concentration in the p-type cladding layer is increased using Zn as an impurity.

In the conventional red semiconductor laser diode with the p-type cladding layer doped with Zn as the impurity, however, the quantity of introducible Zn is so limited that it is difficult to increase the quantity of the impurity (Zn) introduced into the p-type cladding layer. Thus, it is disadvantageously difficult to improve the temperature characteristics of the conventional semiconductor laser diode.

SUMMARY OF THE INVENTION

The present invention has been proposed in order to solve the aforementioned problem, and an object of the present invention is to provide a semiconductor laser diode capable of further improving temperature characteristics while sufficiently preventing a laser beam emission end surface portion from thermal destruction through a window structure and a method of fabricating the same.

In order to attain the aforementioned object, a semiconductor laser diode according to a first aspect of the present invention comprises an active layer having a window structure on a laser beam emission end surface portion and a p-type layer, formed on the surface of the active layer, containing Mg and Zn as impurities, and the impurity concentration of Zn contained in the p-type layer is larger than the impurity concentration of Mg contained in the p-type layer.

In the semiconductor laser diode according to the first aspect, as hereinabove described, the p-type layer containing Mg and Zn as the impurities is so provided on the surface of the active layer that the carrier concentration in the p-type layer can be increased as compared with a p-type layer containing only Zn as an impurity since Mg can be doped up to a higher concentration as compared with Zn. Thus, a band discontinuity value between the active layer and the p-type layer on the side of a conduction band can be so increased as to inhibit electrons supplied to the active layer from thermally overflowing into the p-type layer. Thus, a light output value can be inhibited from reduction with respect to the value of a fed current under a high temperature, whereby temperature characteristics can be improved. The impurity concentration of Zn contained in the p-type layer formed on the surface of the active layer is so rendered larger than that of Mg contained in the p-type layer that the impurities can be easily sufficiently diffused from the p-type layer into the active layer on the emission end surface portion since Zn is more easily diffusible as compared with Mg. Thus, the crystal structure of the active layer on the emission end surface portion can be sufficiently disordered, thereby sufficiently increasing the band gap of the active layer on the emission end surface portion. Therefore, the emission end surface portion of the active layer can be sufficiently inhibited from absorbing light, to be sufficiently prevented from reaching a high temperature. Consequently, the laser beam emission end surface portion can be sufficiently prevented from thermal breakage.

In the aforementioned structure, Mg and Zn are preferably so introduced into the p-type layer as to have impurity concentrations exceeding a prescribed value respectively at least up to a portion of the p-type layer close to the active layer at least in a region of the p-type layer other than the emission end surface portion. According to this structure, the carrier concentration can be increased up to the portion of the p-type layer close to the active layer, thereby further inhibiting the electrons supplied to the active layer from thermally overflowing into the p-type layer.

In the aforementioned structure, Mg and Z are preferably introduced into at least a region of the active layer other than the emission end surface portion. According to this structure, the carrier concentration can be easily increased up to the portion of the p-type layer close to the active layer, thereby easily inhibiting the electrons supplied to the active layer from thermally overflowing into the p-type layer.

In the aforementioned structure, Mg and Zn are preferably introduced into at least the emission end surface portion of the active layer, and the impurity concentration of Zn introduced into the emission end surface portion of the active layer is preferably larger than the impurity concentration of Mg introduced into the emission end surface portion of the active layer. According to this structure, the impurities can be rendered easily diffusible in the emission end surface portion of the active layer since Zn is more easily diffusible as compared with Mg. Thus, the crystal structure of the active layer in the emission end surface portion can be easily sufficiently disordered, thereby easily sufficiently increasing the band gap of the active layer in the emission end surface portion. Consequently, the emission end surface portion of the active layer can be easily sufficiently inhibited from absorbing light.

In the aforementioned structure, the semiconductor laser diode preferably further comprises an n-type layer so formed on the surface of the active layer as to hold the active layer between the same and the p-type layer, while the window structure is preferably formed by diffusing Zn introduced into the emission end surface portion of the p-type layer up to the n-type layer through the active layer. According to this structure, the window structure can be easily formed on the emission end surface portion of the active layer.

In the aforementioned structure, Zn is preferably introduced into the emission end surface portion of the active layer and a region of the active layer other than the emission end surface portion, and the impurity concentration of Zn in the emission end surface portion of the active layer is preferably larger than the impurity concentration of Zn in the region of the active layer other than the emission end surface portion. According to this structure, the crystal structure can be disordered by sufficiently diffusing Zn only in the emission end surface portion of the active layer while inhibiting Zn from disordering the crystal structure by diffusion on the region other than the emission end surface portion of the active layer.

In the aforementioned structure, the semiconductor laser diode preferably further comprises a first laser diode portion including the active layer having the window structure and the p-type layer containing Mg and Zn, a second laser diode portion and a single substrate formed with the first laser diode portion and the second laser diode portion on the surface thereof. Thus, the present invention may be applied to a two-wavelength semiconductor laser diode comprising two laser diode portions.

In the aforementioned structure comprising the first laser diode portion, the second laser diode portion and the substrate, the second laser diode portion preferably also includes an active layer having a window structure and a p-type layer containing Mg and Zn. According to this structure, a two-wavelength semiconductor laser diode comprising two laser diode portions capable of further improving temperature characteristics while sufficiently preventing a laser beam emission end surface portion from thermal breakage due to the window structure can be obtained.

In this case, the first laser diode portion preferably constitutes a red semiconductor laser diode, and the second laser diode portion preferably constitutes an infrared semiconductor laser diode. According to this structure, a semiconductor laser diode comprising a red semiconductor laser diode and an infrared semiconductor laser diode capable of further improving temperature characteristics while sufficiently preventing a laser beam emission end surface portion from thermal breakage due to the window structure can be obtained.

In the aforementioned structure comprising the first laser diode portion, the second laser diode portion and the substrate, the first laser diode portion may constitute either a red semiconductor laser diode or an infrared semiconductor laser diode.

A method of fabricating a semiconductor laser diode according to a second aspect of the present invention comprises steps of forming a first active layer and a second active layer on a single substrate, forming a first p-type layer and a second p-type layer containing Mg and Zn having a larger impurity concentration than Mg as impurities respectively on the surfaces of the first active layer and the second active layer respectively and simultaneously forming window structures on laser beam emission end surface portions of the first active layer and the second active layer respectively by simultaneously performing Zn diffusion on the first active layer and the p-type first layer as well as the second active layer and the second p-type layer.

In the method of fabricating a semiconductor laser diode according to the second aspect, as hereinabove described, the first and second p-type layers containing Mg and Zn as the impurities respectively are provided on the surfaces of the first and second active layers respectively so that carrier concentrations in the first and second p-type layers can be increased as compared with first and second p-type layers containing only Zn as the impurity since Mg can be doped up to a higher concentration as compared with Zn. Thus, band discontinuity values between the first active layer and the first p-type layer and between the second active layer and the second p-type layer on the sides of conduction bands can be increased, thereby inhibiting electrons supplied to the first and second active layers from thermally overflowing into the first and second p-type layers respectively. Thus, a light output value can be inhibited from reduction with respect to the value of a fed current under a high temperature, whereby temperature characteristics can be improved. The impurity concentrations of Zn contained in the first and second p-type layers formed on the surfaces of the first and second active layers are so rendered larger than those of Mg contained in the first and second p-type layers that the impurities can be rendered sufficiently diffusible from the first and second p-type layers into the first and second active layers on the emission end surface portions respectively since Zn is more easily diffusible as compared with Mg. Thus, the crystal structures of the first and second active layers in the emission end surface portions can be sufficiently disordered, thereby sufficiently increasing the band gaps of the first and second active layers on the emission end surface portions. Therefore, the emission end surface portions of the first and second active layers can be sufficiently inhibited from absorbing light, to be sufficiently prevented from reaching high temperatures. Consequently, the laser beam emission end surface portions can be sufficiently prevented from thermal breakage. Further, the window structures are simultaneously formed on the laser beam emission end surface portions of the first and second active layers respectively, whereby a process of fabricating the semiconductor laser diode can be simplified and the fabrication time therefor can be reduced.

In the aforementioned structure, the step of forming the first p-type layer and the second p-type layer containing Mg and Zn as impurities respectively preferably includes a step of introducing Mg and Zn into at least regions of the first p-type layer and the second p-type layer other than the emission end surface portions to have impurity concentrations exceeding a prescribed value respectively at least up to a portion of the first p-type layer close to the first active layer and at least up to a portion of the second p-type layer close to the second active layer respectively. According to this structure, the carrier concentrations can be increased up to the portions of the first and second p-type layers close to the first and second active layers respectively, thereby further inhibiting electrons supplied to the first and second active layers from thermally overflowing into the first and second p-type layers respectively.

In the aforementioned structure, the method of fabricating a semiconductor laser diode preferably further comprises a step of introducing Mg and Zn into at least regions of the first active layer and the second active layer other than the emission end surface portions. According to this structure, the carrier concentrations can be easily increased up to the portions of the first and second p-type layers close to the first and second active layers respectively, thereby easily inhibiting electrons supplied to the first and second active layers from thermally overflowing into the first and second p-type layers respectively.

In the aforementioned structure comprising the step of introducing Mg and Zn into at least the regions of the first and second active layers other than the emission end surface portions, the step of introducing Mg and Zn into at least the regions of the first active layer and the second active layer other than the emission end surface portions preferably includes a step of introducing Zn having smaller impurity concentrations than Zn in the emission end surface portions of the first active layer and the second active layer into the regions of the first active layer and the second active layer other than the emission end surface portions respectively. According to this structure, the crystal structures can be disordered by sufficiently diffusing Zn only in the emission end surface portions of the first and second active layers while inhibiting Zn from disordering the crystal structures through diffusion in the regions of the first and second active layers other than the emission end surface portions.

In the aforementioned structure, the step of simultaneously forming the window structures on the laser beam emission end surface portions of the first active layer and the second active layer respectively preferably includes a step of introducing Mg and Zn having a larger impurity concentration than Mg into at least the emission end surface portions of the first active layer and the second active layer. According to this structure, the impurities can be rendered easily diffusible into the first and second active layers in the emission end surface portions since Zn is more easily diffusible as compared with Mg. Thus, the crystal structures of the first and second active layers in the emission end surface portions can be easily sufficiently disordered, thereby easily sufficiently increasing the band gaps of the first and second active layers in the emission end surface portions. Consequently, the emission end surface portions of the first and second active layers can be sufficiently inhibited from absorbing light.

In the aforementioned structure, the step of forming the first p-type layer and the second p-type layer preferably includes steps of forming the first p-type layer on the surface of the first active layer to hold the first active layer between the same and the first n-type layer and forming the second p-type layer on the surface of the second active layer to hold the second active layer between the same and the second n-type layer, and the step of simultaneously forming the window structures on the laser beam emission end surface portions of the first active layer and the second active layer respectively preferably includes a step of forming the window structures by diffusing Zn introduced into the emission end surface portion of the first p-type layer up to the first n-type layer through the first active layer while diffusing Zn introduced into the emission end surface portion of the second p-type layer up to the second n-type layer through the second active layer. According to this structure, the window structures can be easily formed on the emission end surface portions of the first and second active layers.

In the aforementioned structure, the method of fabricating a semiconductor laser diode preferably further comprises a step of forming a red semiconductor laser diode including the first active layer formed with the window structure and the first p-type layer and an infrared semiconductor laser diode including the second active layer formed with the window structure and the second p-type layer. According to this structure, the semiconductor laser diode comprising the red semiconductor laser diode and the infrared semiconductor laser diode capable of improving temperature characteristics can be obtained while sufficiently preventing the laser beam emission end surface portions from thermal breakage due to the window structures.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

The structure of a red semiconductor laser diode according to a first embodiment of the present invent is described with reference to FIGS. 1 to 3.

Figure 1:
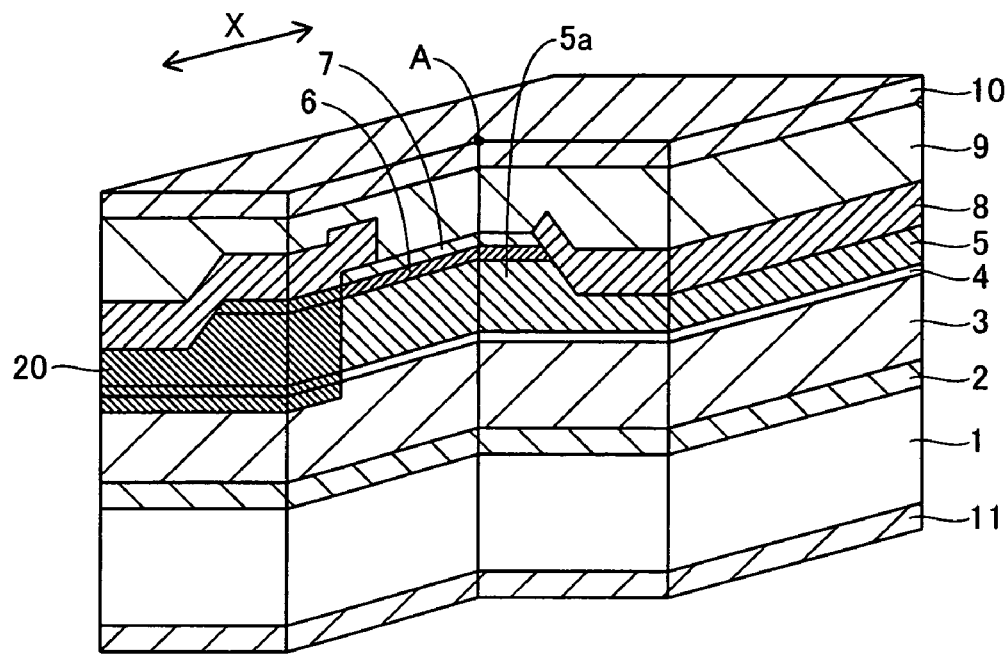
FIG. 1 is a perspective view showing the structure of a red semiconductor laser diode according to a first embodiment of the present invention.

In the red semiconductor laser diode according to the first embodiment of the present invention, a buffer layer 2 of n-type GaInP having a thickness of about 0.3 µm is formed on a GaAs substrate 1, as shown in FIG. 1. An n-type cladding layer 3 of n-type AlGaInP doped with Si having a thickness of about 2.5 µm is formed on the buffer layer 2. The n-type cladding layer 3 is an example of the "n-type layer" in the present invention.

According to the first embodiment, an active layer 4 containing Mg and Zn in prescribed impurity concentrations is formed on the n-type cladding layer 3. This active layer 4 has a multiple quantum well (MQW) structure. As shown in FIG. 2, the active layer 4 has a strain compensation multiple quantum well structure formed by alternately stacking three well layers 4b of GaInP each having a thickness of about 6 nm and two barrier layers 4c of AlGaInP each having a thickness of about 4 nm between two light guide layers 4a of AlGaInP each having a thickness of about 15 nm, as shown in FIG. 2.

According to the first embodiment, a p-type cladding layer 5 of p-type AlGaInP, simultaneously doped with Mg and Zn up to a portion close to the active layer 4, having a thickness of about 1.5 µm is formed on the active layer 4, as shown in FIG. 1. The p-type cladding layer 5 is an example of the "p-type layer" in the present invention. This p-type cladding layer 5 is so doped with Mg and Zn that the doses thereof are about $1\times10^{17}$ cm$^{-3}$ and about $5\times10^{17}$ cm$^{-3}$ respectively in the portion close to the active layer 4, as shown in FIG. 3.

A trapezoidal projecting portion 5a is formed on the p-type cladding layer 5, as shown in FIG. 1. A p-type contact layer 6 of p-type GaInP simultaneously doped with Mg and Zn having a thickness of about 0.1 µm is formed to be in contact with the overall upper surface of the projecting portion 5a. The projecting portion 5a of the p-type cladding layer 5 and the p-type contact layer 6 constitute a striped (slender) ridge portion extending in a prescribed direction (along arrow X in FIG. 1).

According to the first embodiment, a Zn diffusion region 20 containing Zn as an impurity is formed on emission end surface portions of the n-type cladding layer 3, the active layer 4, the p-type cladding layer 5 and the p-type contact layer 6. More specifically, Zn introduced into the emission end surface portion of the p-type cladding layer 5 is diffused into this Zn diffusion region 20, to extrude toward the n-type cladding layer 3 through the active layer 4. Thus, atoms constituting the well layers 4b and the barrier layers 4c of the active layer 4 are mutually diffused, to disorder the multiple quantum well structure on the emission end surface portion of the active layer 4. Therefore, the band gap of the emission end surface portion of the active layer 4 is enlarged beyond those of the remaining portions, to form a window structure. In addition to Zn, Mg is also introduced into portions of the p-type cladding layer 5 and the active layer 4 located on the Zn diffusion region 20.

According to the first embodiment, a portion of the Zn diffusion region 20 corresponding to the active layer 4 has a larger Zn concentration than the remaining portion of the Zn diffusion region 20. Further, the Zn concentration in the portion of the Zn diffusion region 20 corresponding to the active layer 4 is larger than the Mg concentration in this portion.

A lower cap layer 7 of p-type GaAs doped with Zn having a thickness of about 0.3 µm is formed on the p-type contact layer 6. A current blocking layer 8 consisting of an n-type AlInP layer having a thickness of about 0.4 µm and an n-type GaAs layer having a thickness of about 0.4 µm is formed to cover the upper surface of the p-type cladding layer 5, the side surfaces of the projecting portion 5a of the p-type cladding layer 5, the side surfaces of the p-type contact layer 6 and the side surfaces other than the upper surface as well as an upper surface portion, closer to an emission end surface portion, of the lower cap layer 7. Thus, the current blocking layer 8 is so formed as to cover the upper surface portion closer to the emission end surface portion, thereby forming an end current non-injection structure injecting no current into the emission end surface portion of the ridge portion.

An upper cap layer 9 of p-type GaAs doped with Zn having a thickness of about 1.0 µm is formed on the current blocking layer 8 and the lower cap layer 7. The lower and upper cap layers 7 and 9 constitute a cap layer. A p-side electrode 10 consisting of a Cr layer and an Au layer is formed on the upper cap layer 9. An n-side electrode 11 consisting of an Au layer, a Ge layer, an Ni layer and another Au layer is formed on the back surface of the GaAs substrate 1.

According to the first embodiment, as hereinabove described, the p-type cladding layer 5 containing Mg and Zn as impurities is so provided on the active layer 4 that a carrier concentration in the p-type cladding layer 5 can be increased as compared with a p-type cladding layer containing only Zn as an impurity, since Mg can be doped up to a higher concentration as compared with Zn. Thus, a band discontinuity value between the active layer 4 and the p-type cladding layer 5 on the side of a conduction band can be so increased as to inhibit electrons supplied to the active layer 4 from thermally overflowing into the p-type cladding layer 5. Therefore, a light output value can be inhibited from reduction with respect to the value of a fed current under a high temperature, whereby temperature characteristics can be improved. Further, the impurity concentration of Zn contained in the p-type cladding layer 5 formed on the active layer 4 is so rendered larger than the impurity concentration of Mg contained in the p-type cladding layer 5 that the impurities can be rendered sufficiently diffusible from the p-type cladding layer 5 into the active layer 4 on the emission end surface portions since Zn is more easily diffusible as compared with Mg. Thus, the multiple quantum well structure of the active layer 4 can be sufficiently disordered on the emission end surface portion, thereby sufficiently increasing the band gap of the active layer 4 on the emission end surface portion. Therefore, the emission end surface portion of the active layer 4 can be sufficiently inhibited from absorbing light, not to reach a high temperature. Consequently, the emission end surface portion for a laser beam can be sufficiently prevented from thermal breakage.

According to the first embodiment, the p-type cladding layer 5 is so doped with Mg and Zn in the portion close to the active layer 4 that the doses thereof are about $1\times10^{17}$ cm$^{-3}$ and about $5\times10^{17}$ cm$^{-3}$ respectively, whereby the carrier concentration can be increased up to the portion of the p-type cladding layer 5 close to the active layer 4 for further inhibiting the electrons supplied to the active layer 4 from thermally overflowing into the p-type cladding layer 5.

According to the first embodiment, the carrier concentration can be easily increased up to the portion of the p-type cladding layer 5 close to the active layer 4 by introducing Mg and Zn into the active layer 4, thereby easily inhibiting the electrons supplied to the active layer 4 from thermally overflowing into the p-type cladding layer 5.

According to the first embodiment, the Zn concentration in the emission end surface portion of the active layer 4 is so rendered larger than the Mg concentration in this portion that the multiple quantum well structure of the active layer 4 can be easily sufficiently disordered on the emission end surface portion by diffusing Zn in the active layer 4 on the emission end surface portion since Zn is more easily diffusible as compared with Mg. Thus, the band gap of the active layer 4 on the emission end surface portion can be easily sufficiently increased, thereby easily sufficiently inhibiting the active layer 4 from absorbing light on the emission end surface portion.

According to the first embodiment, Zn is diffused from the emission end surface portion of the p-type cladding layer 5 into the n-type cladding layer 3 through the active layer 4 to form the window structure so that Zn can be easily sufficiently diffused from the emission end surface portion of the p-type cladding layer 5 into the active layer 4, whereby the window structure can be easily formed on the emission end surface portion of the active layer 4.

According to the first embodiment, the Zn concentration in the emission end surface portion of the active layer 4 is rendered larger than that in the remaining region of the active layer 4 so that the multiple quantum well structure can be disordered by sufficiently diffusing Zn only in the emission end surface portion of the active layer 4 while inhibiting Zn from disordering the multiple quantum well structure by diffusion on the region other than the emission end surface portion of the active layer 4.

A process of fabricating the red semiconductor laser diode according to the first embodiment of the present invention is now described with reference to FIGS. 1, 2 and 4 to 10.

Figure 4:
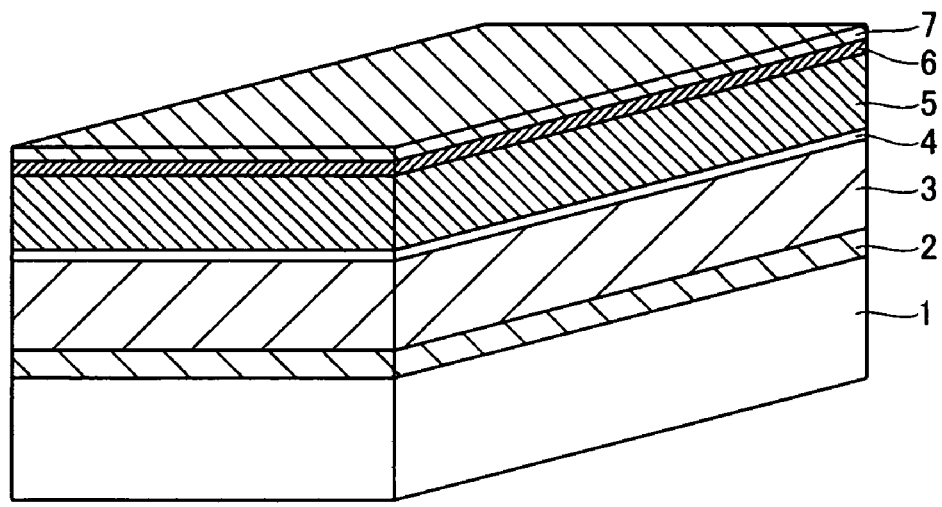
FIGS. 4 to 10 are sectional views for illustrating a process of fabricating the red semiconductor laser diode according to the first embodiment shown in FIG. 1.

As shown in FIG. 4, the buffer layer 2, the n-type cladding layer 3, the active layer 4, the p-type cladding layer 5, the p-type contact layer 6 and the lower cap layer 7 are successively grown on the GaAs substrate 1 by MOCVD.

More specifically, the buffer layer 2 of n-type GaInP having the thickness of about 0.3 μm is grown on the GaAs substrate 1. Thereafter the n-type cladding layer 3 of n-type AlGaInP doped with Si having the thickness of about 2.5 μm is grown on the buffer layer 2.

Figure 2:
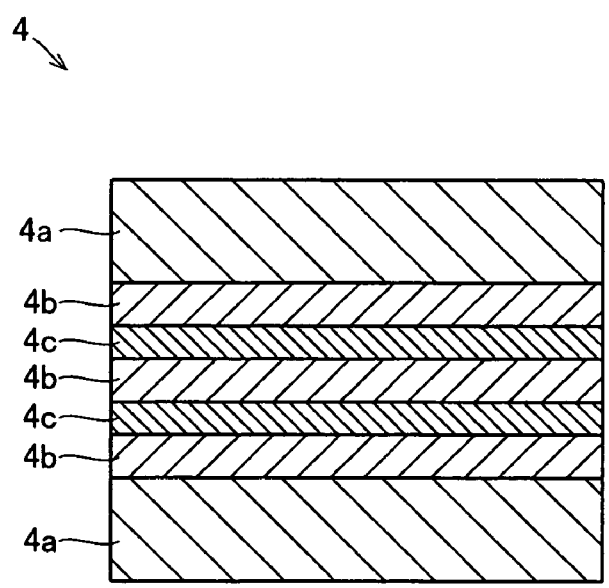
FIG. 2 is an enlarged sectional view showing an active layer of the red semiconductor laser diode according to the first embodiment shown in FIG. 1 in detail.
Figure 3:
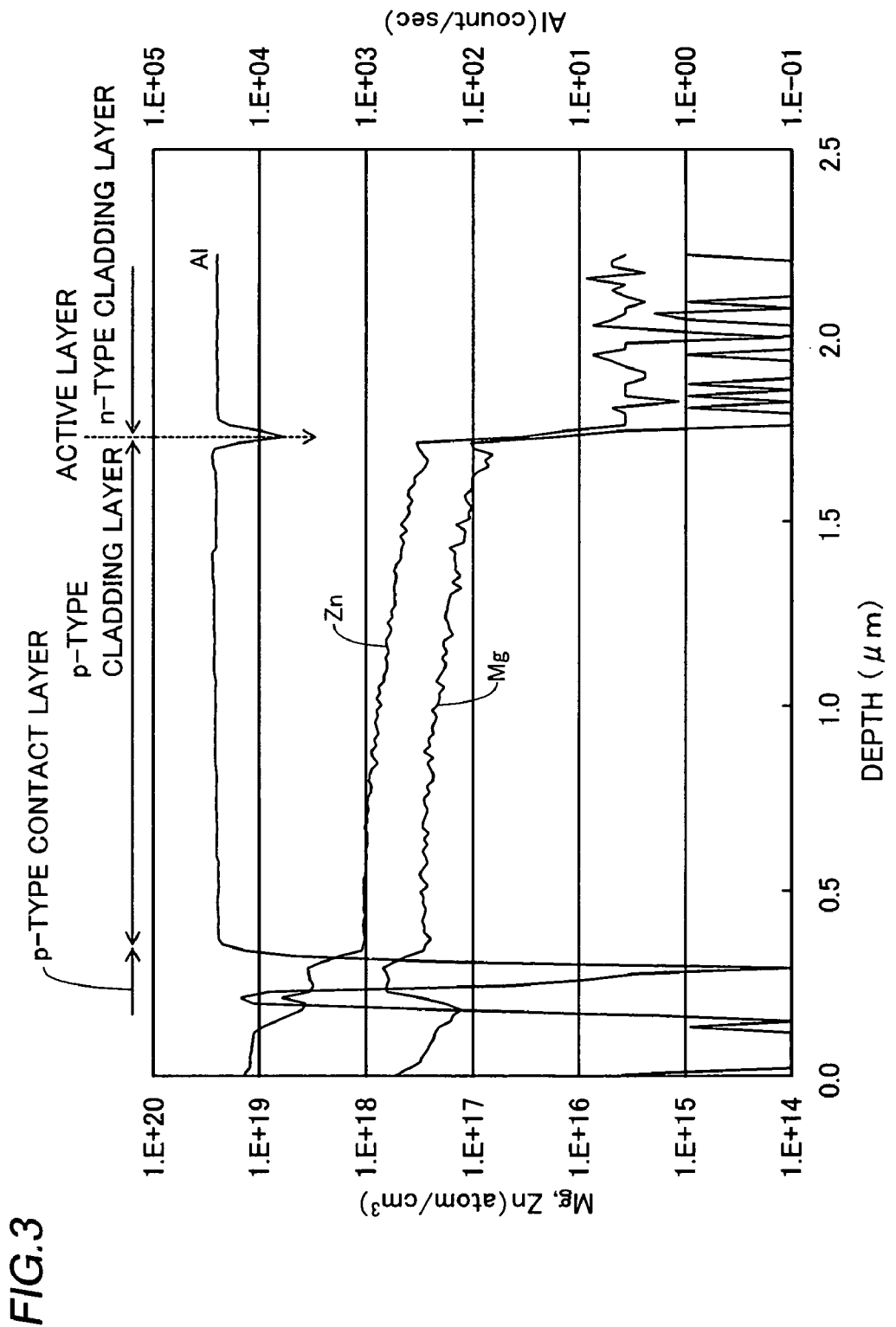
FIG. 3 illustrates the impurity concentrations of Mg and Zn with respect to a depth direction at a point A of the red semiconductor laser diode according to the first embodiment shown in FIG. 1.

Then, one of the light guide layers 4a of AlGaInP having the thickness of about 15 nm is grown on the n-type cladding layer 3 (see FIG. 4), as shown in FIG. 2. Thereafter the three well layers 4b of GaInP each having the thickness of about 6 nm and the two barrier layers 4c of AlGaInP each having the thickness of about 4 nm are alternately grown on the light guide layer 4a. Then, the other one of the light guide layers 4a of AlGaInP having the thickness of about 15 nm is grown on the uppermost well layer 4b, thereby forming the active layer 4.

As shown in FIG. 4, the p-type cladding layer 5, having the thickness of about 1.5 μm, consisting of an undoped AlGaInP layer of about 50 nm in thickness and a p-type AlGaInP layer simultaneously doped with Mg and Zn is grown on the active layer 4. At this time, the p-type cladding layer 5 is doped with Mg and Zn so that the doses thereof are about $1 \times 10^{17}$ cm$^{-3}$ and about $5 \times 10^{17}$ cm$^{-3}$ respectively. Then, the p-type contact layer 6 of p-type GaInP simultaneously doped with Mg and Zn having the thickness of about 0.1 μm is formed on the p-type cladding layer 5. Thereafter the lower cap layer 7 of p-type GaAs doped with Zn is grown on the p-type contact layer 6.

Figure 5:
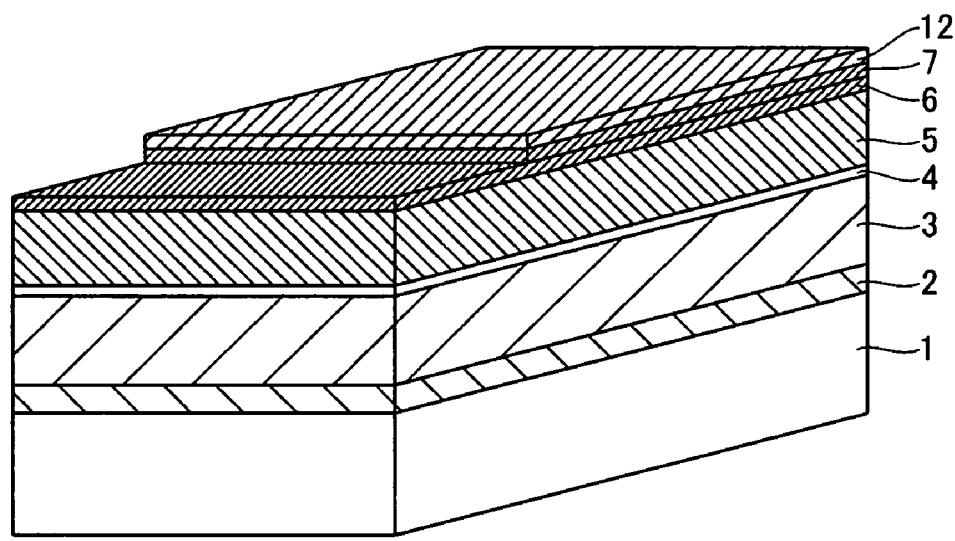

As shown in FIG. 5, an SiN layer 12 is formed on a prescribed region (other than the emission end surface portion) of the lower cap layer 7 by plasma CVD. Thereafter the SiN layer 12 is employed as a mask for etching the lower cap layer 7, thereby removing the emission end surface portion thereof.

Figure 6:
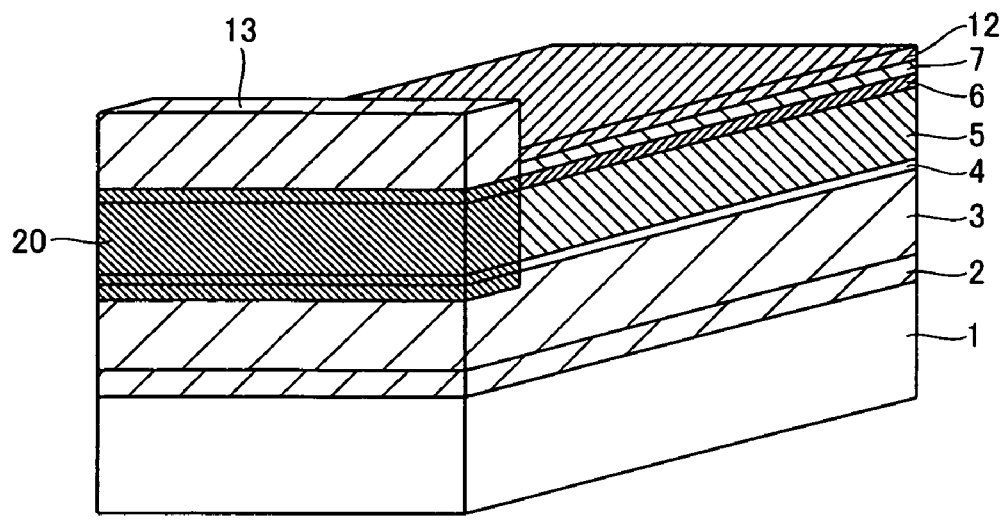

As shown in FIG. 6, a diffusion source 13 of ZnO is grown on the etched portion (emission end surface portion) of the lower cap layer 7. Thereafter heat treatment is performed at a temperature of about 500° C. for about 20 minutes, thereby diffusing Zn contained in the emission end surface portion of the p-type cladding layer 5 into the n-type cladding layer 3 through the active layer 4. Then, the Zn diffusion region 20 having the window structure is formed on the emission end surface portions of the n-type cladding layer 3, the active layer 4, the p-type cladding layer 5 and the p-type contact layer 6. At this time, the multiple quantum well (MQW) structure of the active layer 4 on the Zn diffusion region 20 is disordered to increase the band gap of the active layer 4 on the Zn diffusion region 20. In other words, the Zn diffusion region 20 having the window structure is formed by further diffusing Zn from the diffusion source 13 into the emission end surface portion of the p-type cladding layer 5 previously simultaneously doped with Mg and Zn in crystal growth according to the first embodiment.

Figure 7:
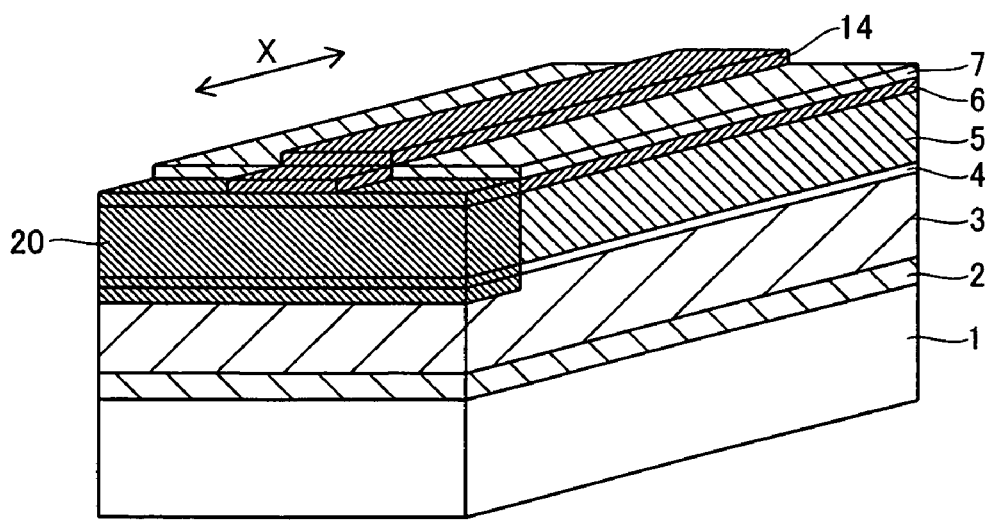

As shown in FIG. 7, the diffusion source 13 (see FIG. 6) and the SiN layer 12 (see FIG. 6) are removed, and an SiO$_2$ layer 14 extending in a prescribed direction (along arrow X in FIG. 5) is formed on prescribed regions of the p-type contact layer 6 and the lower cap layer 7.

Figure 8:
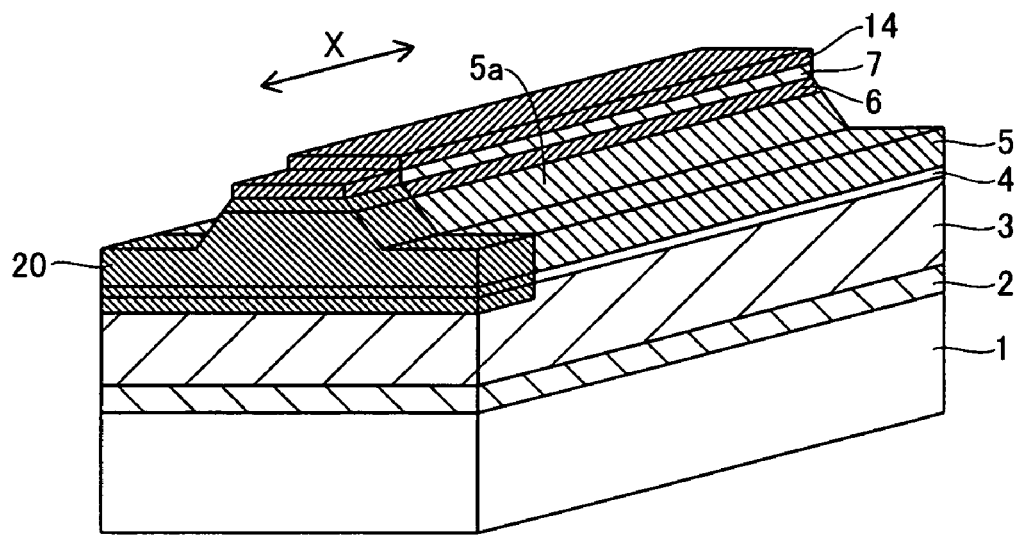

As shown in FIG. 8, the SiO$_2$ layer 14 is employed as a mask for partially etching the lower cap layer 7, the p-type contact layer 6 and the p-type cladding layer 5 by prescribed thicknesses from the upper surfaces thereof respectively. Thus, the projecting portion 5a of the p-type cladding layer 5 and the p-type contact layer 6 constitute the striped (slender) ridge portion extending in the prescribed direction (along arrow X in FIG. 6). Thereafter a prescribed region of the SiO$_2$ layer 14 is removed as shown in FIG. 9.

Figure 9:
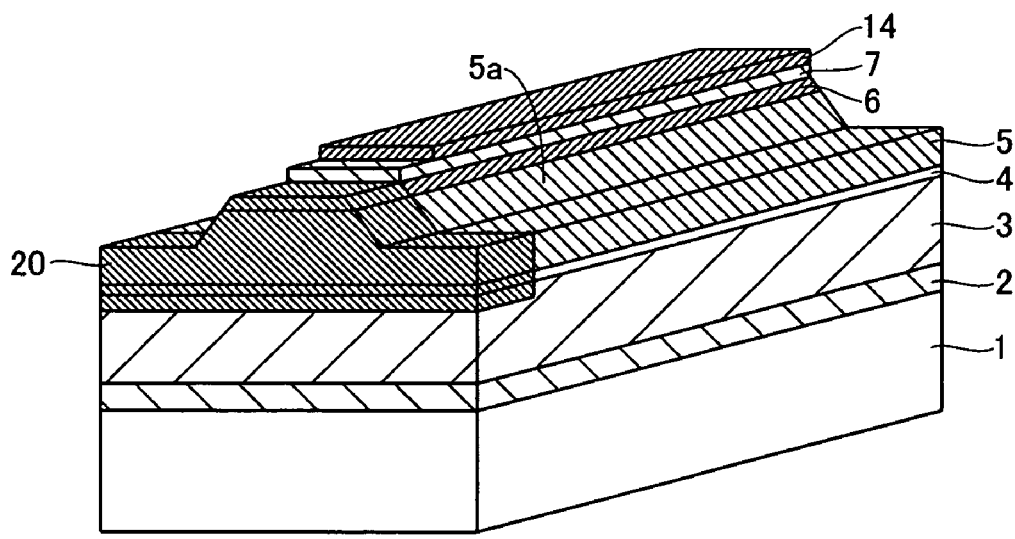
Figure 10:
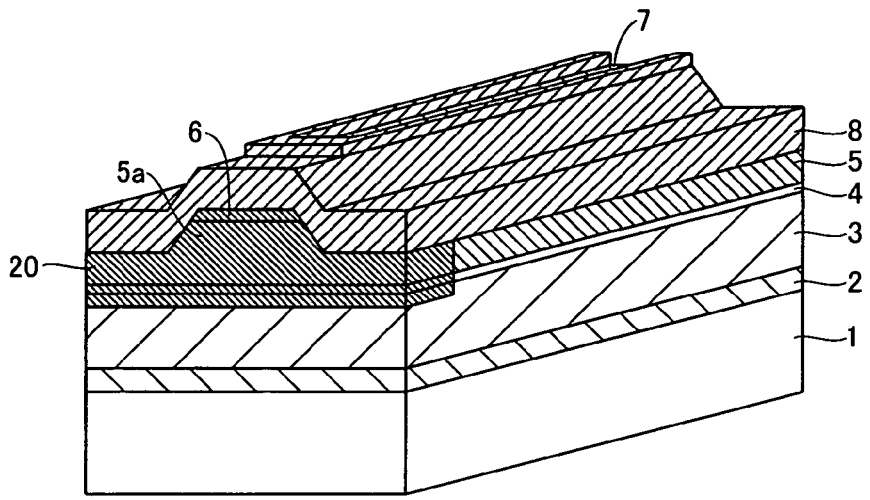

As shown in FIG. 10, the current blocking layer 8 consisting of the n-type AlInP layer having the thickness of about 0.4 μm and the n-type GaAs layer having the thickness of about 0.4 μm is formed by MOCVD to cover the upper surface of the p-type cladding layer 5, the side surfaces of the projecting portion 5a of the p-type cladding layer 5, the upper and side surfaces of the p-type contact layer 6, the upper and side surfaces of the lower cap layer 7 and the side surfaces of the SiO$_2$ layer 14 (see FIG. 9). At this time, the end current non-injection structure is formed to inject no current into the emission end surface portion of the ridge portion. Thereafter the SiO$_2$ layer 14 (see FIG. 9) is removed.

Then, the upper cap layer 9 of p-type GaAs doped with Zn having the thickness of about 1.0 μm is formed by MOCVD to cover the overall surface, as shown in FIG. 1. Thus, the lower and upper cap layers 7 and 9 constitute the cap layer. Thereafter heat treatment is performed at a temperature of about 500° C. for about 20 minutes, in order to activate the impurities. Then, the p-side electrode 10 consisting of the Cr layer and the Au layer is formed on the upper cap layer 9 by electron beam evaporation. Thereafter the n-side electrode 11 consisting of the Au layer, the Ge layer, the Ni layer and the other Au layer is formed on the back surface of the GaAs substrate 1 by electron beam evaporation. Finally, electrode alloying is performed at a temperature of about 450° C. for about 15 minutes. Mg and Zn are diffused from the region of the p-type cladding layer 5 other than the emission end surface portion into the active layer 4 due to the thermal hysteresis including the aforementioned heat treatment for forming the window structure, the crystal growth of the current blocking layer 8 and the upper cap layer 9, the heat treatment for activating the impurities and the electrode alloying. The quantity of Zn diffused from the region of the p-type cladding layer 5 other than the emission end surface portion into the active layer 4 is smaller than the quantity of Zn diffused from the emission end surface portion of the p-type cladding layer 5 into the active layer 4, whereby the Zn concentration in the region of the active layer 4 other than the emission end surface portion is smaller than the Zn concentration in the emission end surface portion of the active layer 4. The red semiconductor laser diode according to the first embodiment is formed in the aforementioned manner.

Experiments conducted for confirming effects of the red semiconductor laser diode according to the first embodiment are now described with reference to FIGS. 11 to 14.

First, a comparative experiment conducted on current-light output characteristics (I-L characteristics) with respect to the compositions of impurities introduced into p-type cladding layers is described with reference to FIG. 11. In this comparative experiment, a sample A according to Example 1 corresponding to the first embodiment and samples B to D according to comparative examples 1 to 3 were prepared and subjected to evaluation of the current-light output characteristics (I-L characteristics).

The sample A according to Example 1 was prepared through the aforementioned fabrication process according to the first embodiment. In other words, the sample A according to Example 1 was prepared by doping a p-type cladding layer 5 with Mg and Zn so that the doses thereof were about $1 \times 10^{17}$ cm$^{-3}$ and about $5 \times 10^{17}$ cm$^{-3}$ respectively in a portion close to an active layer 4. The sample B according to comparative example 1 was prepared by doping a p-type cladding layer with only Zn so that the dose thereof was about $6 \times 10^{17}$ cm$^{-3}$ in a portion close to an active layer. The sample C according to comparative example 2 was prepared by doping a p-type cladding layer with only Mg so that the dose thereof was about $6 \times 10^{17}$ cm$^{-3}$ in a portion close to an active layer. The sample D according to comparative example 3 was prepared by doping a p-type cladding layer with Mg and Zn so that the doses thereof were about $5 \times 10^{17}$ cm$^{-3}$ and about $1 \times 10^{17}$ cm$^{-3}$ respectively in a portion close to an active layer. The remaining conditions for preparing the samples B to D according to comparative examples 1 to 3 were similar to those for the sample A according to Example 1. The current-light output characteristics of these samples A to D were measured under conditions of a temperature of 80° C., a pulse width of 30 ns and an operating pulse ratio (duty ratio) of 33%. FIG. 11 shows the results.

Figure 11:
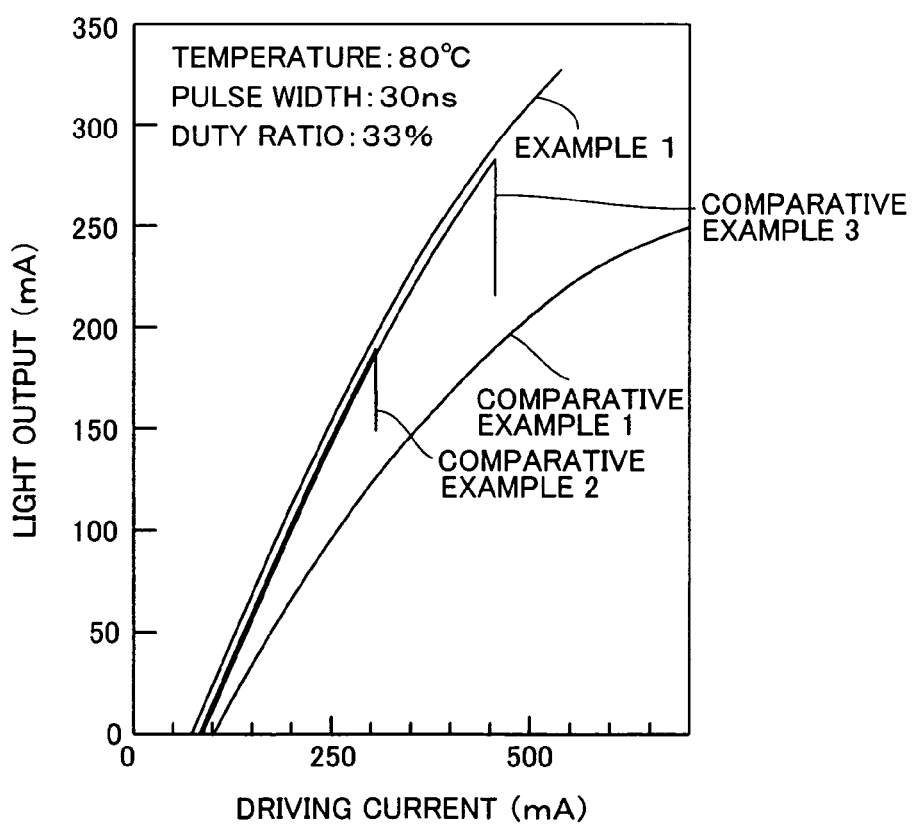
FIGS. 11 to 14 are diagrams for illustrating experiments conducted for confirming effects of the red semiconductor laser diode according to the first embodiment shown in FIG. 1.

Referring to FIG. 11, it has been proved that the light output value with respect to a prescribed current value was larger in the sample A according to Example 1 corresponding to the first embodiment prepared by doping the p-type cladding layer 5 with Mg and Zn so that the doses thereof were about $1 \times 10^{17}$ cm$^{-3}$ and about $5 \times 10^{17}$ cm$^{-3}$ respectively in the portion close to the active layer 4 as compared with the sample B according to comparative example 1 prepared by doping the p-type cladding layer with only Zn so that the dose thereof was about $6 \times 10^{17}$ cm$^{-3}$ in the portion close to the active layer, conceivably for the following reason: In the sample A according to Example 1 corresponding to the first embodiment, it was possible to increase the carrier concentration in the p-type cladding layer 5 by doping the same not only with Zn but also with Mg, whereby it was conceivably possible to increase a band discontinuity value between the active layer 4 and the p-type cladding layer 5 on the side of a conduction band. Thus, it was possible to inhibit electrons supplied to the active layer 4 from thermally overflowing into the p-type cladding layer 5, thereby conceivably preventing the light output value from reduction with respect to the prescribed current value under a high temperature (80° C.).

It has also been proved that the COD level was more improved in the sample A according to Example 1 corresponding to the first embodiment prepared by doping the p-type cladding layer 5 with Mg and Zn so that the doses thereof were about $1 \times 10^{17}$ cm$^{-3}$ and about $5 \times 10^{17}$ cm$^{-3}$ respectively in the portion close to the active layer 4 as compared with the sample C according to comparative example 2 prepared by doping the p-type cladding layer with only Mg so that the dose thereof was about $6 \times 10^{17}$ cm$^{-3}$ in the portion close to the active layer and the sample D according to comparative example 3 prepared by doping the p-type cladding layer with Mg and Zn so that the doses thereof were about $5 \times 10^{17}$ cm$^{-3}$ and about $1 \times 10^{17}$ cm$^{-3}$ respectively in the portion close to the active layer, conceivably for the following reason: In the sample A according to Example 1, it was conceivably possible to sufficiently diffuse the impurities from the p-type cladding layer 5 into the active layer 4 on the emission end surface portion by rendering the dose of Zn more easily diffusible as compared with Mg larger than that of Mg. Thus, it was possible to sufficiently disorder a multiple quantum well structure of the active layer 4 on the emission end surface portion, thereby conceivably sufficiently increasing the band gap of the active layer 4 on the emission end surface portion. Thus, it was possible to sufficiently inhibit the emission end surface portion of the active layer 4 from absorbing light, thereby conceivably inhibiting the emission end surface portion of the active layer 4 from reaching a high temperature. Consequently, it was conceivably possible to sufficiently prevent the emission end surface portion for a laser beam from thermal breakage.

Another comparative experiment conducted on aging characteristics with respect to the total quantities of impurities introduced into p-type cladding layers and photoluminescence spectra of active layers is described with reference to FIGS. 12 and 13. In this comparative experiment, a sample E according to Example 2 corresponding to the first embodiment and a sample F according to comparative example were prepared and subjected to evaluation of the aging characteristics and the photoluminescence spectra of the active layers 4.

The sample E according to Example 2 was prepared through a fabrication process similar to that for the aforementioned sample A according to Example 1. In other words, the sample E according to Example 2 was prepared by doping a p-type cladding layer 5 with Mg and Zn so that the doses thereof were about $1 \times 10^{17}$ cm$^{-3}$ and about $5 \times 10^{17}$ cm$^{-3}$ respectively in a portion close to an active layer 4. The sample F according to comparative example 4 was prepared by doping a p-type cladding layer with Mg and Zn so that the doses thereof were about $1.5 \times 10^{17}$ cm$^{-3}$ and about $7 \times 10^{17}$ cm$^{-3}$ respectively in a portion close to an active layer. The remaining conditions for preparing the sample F according to comparative example 4 were similar to those for the sample E according to Example 2. Time-operating current characteristics of these samples E and F were measured under conditions of a temperature of 80° C. and a pulse of 80 mW along with measurement of the photoluminescence spectra of the active layers, and the photoluminescence spectra of the active layers were so normalized that the maximum values thereof were 1.0. FIGS. 12 and 13 show the results respectively.

Figure 12:
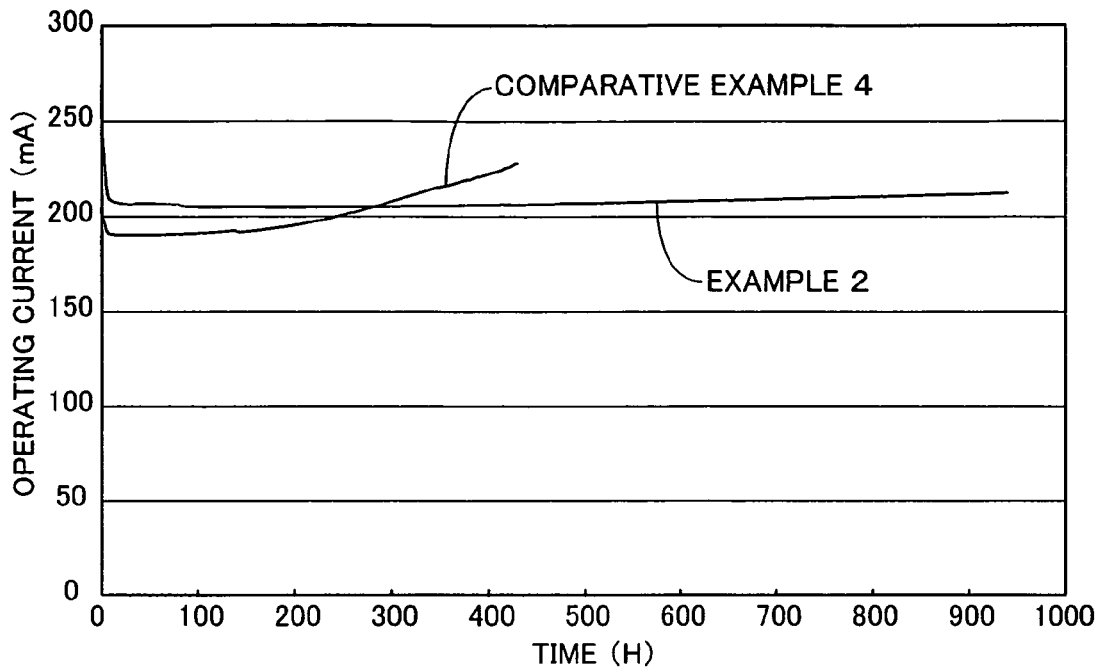

Referring to FIG. 12, it has been proved that the sample E according to Example 2 corresponding to the first embodiment prepared by doping the p-type cladding layer 5 with Mg and Zn so that the doses thereof were about $1 \times 10^{17}$ cm$^{-3}$ and about $5 \times 10^{17}$ cm$^{-3}$ respectively in the portion close to the active layer 4 stably operated over a longer period as compared with the sample F according to comparative example 4 prepared by doping the p-type cladding layer with Mg and Zn so that the doses thereof were about $1.5 \times 10^{17}$ cm$^{-3}$ and about $7 \times 10^{17}$ cm$^{-3}$ respectively in the portion close to the active layer. More specifically, the sample E according to Example 2 corresponding to the first embodiment stably operated for at least about 950 hours. On the other hand, the sample F according to comparative example 4 was deteriorated after operating for about 400 hours, conceivably for the following reason: In the sample E according to Example 2, the concentrations of the impurities diffused from the region of the p-type cladding layer 5 other than an emission end surface portion into the active layer 4 were conceivably smaller than prescribed values, to exert no bad influence on the reliability of the red semiconductor laser diode. In the sample F according to comparative example 4, on the other hand, the concentrations of the impurities diffused from the region of the p-type cladding layer other than an emission end surface portion into the active layer conceivably exceeded the prescribed values to exert bad influence on the reliability of the red semiconductor laser diode. Therefore, the doses of Mg and Zn are conceivably preferably set to less than about $1.5 \times 10^{17}$ cm$^{-3}$ and less than about $7 \times 10^{17}$ cm$^{-3}$ respectively in the portion of the p-type cladding layer close to the active layer.

Figure 13:
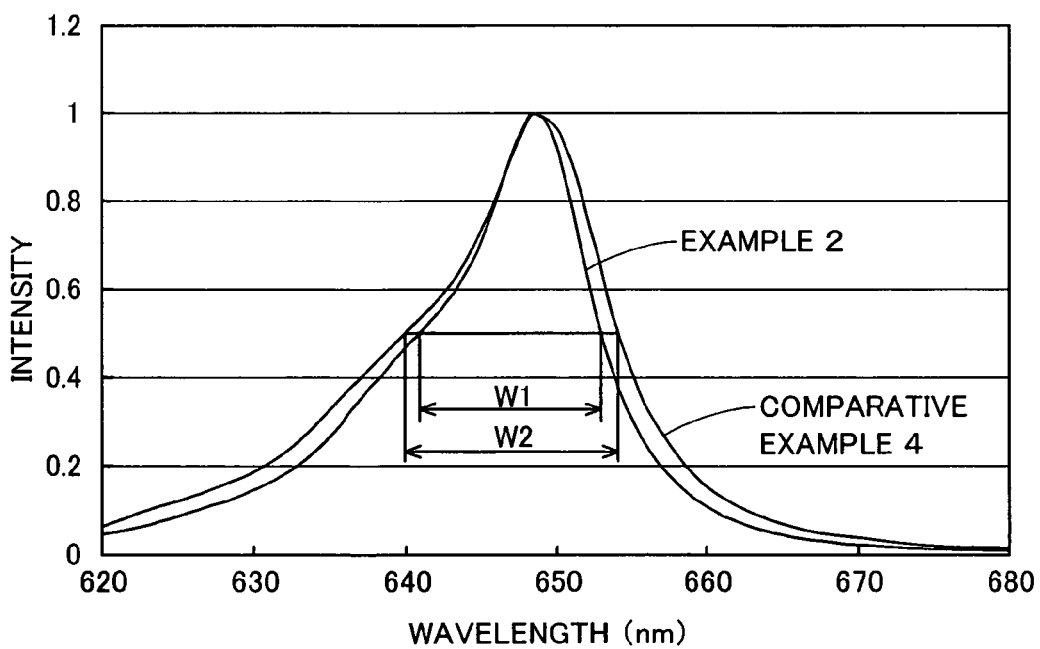

Referring to FIG. 13, it has also been proved that the half width of the photoluminescence spectrum of the active layer 4 was more reducible in the sample E according to Example 2 corresponding to the first embodiment prepared by doping the p-type cladding layer 5 with Mg and Zn so that the doses thereof were about $1 \times 10^{17}$ cm$^{-3}$ and about $5 \times 10^{17}$ cm$^{-3}$ respectively in the portion close to the active layer 4 as compared with the sample F according to comparative example 4 prepared by doping the p-type cladding layer with Mg and Zn so that the doses thereof were about $1.5 \times 10^{17}$ cm$^{-3}$ and about $7 \times 10^{17}$ cm$^{-3}$ respectively in the portion close to the active layer. More specifically, the half width (W1) was about 12 nm in the sample E according to Example 2 corresponding to the first embodiment, while the half width (W2) was about 14 nm in the sample F according to comparative example 4. Thus, the recording density of the red semiconductor laser diode can be improved in the sample E according to Example 2 corresponding to the first embodiment.

Still another comparative experiment conducted on current-light output characteristics (I-L characteristics) with respect to presence/absence of window structures on emission end surface portions is described with reference to FIG. 14. In this comparative experiment, a sample G according to Example 3 corresponding to the first embodiment and a sample H according to comparative example 5 were prepared and subjected to evaluation of the current-light output characteristics (I-L characteristics).

The sample G according to Example 3 was prepared through the aforementioned fabrication process according to the first embodiment. In other words, the sample G according to Example 3 was prepared by forming a Zn diffusion region 20 having a window structure on emission end surface portions of an n-type cladding layer 3, an active layer 4, a p-type cladding layer 5 and a p-type contact layer 6. On the other hand, the sample H according to comparative example 5 was prepared by forming no Zn diffusion region having a window structure on emission end surface portions of an n-type cladding layer, an active layer, a p-type cladding layer and a p-type contact layer. The remaining conditions for preparing the sample H according to comparative example 5 were similar to those for the sample G according to Example 3. The current-light output characteristics of these samples G and H were measured by continuously feeding currents thereto at a temperature of about 25° C. FIG. 14 shows the results.

Figure 14:
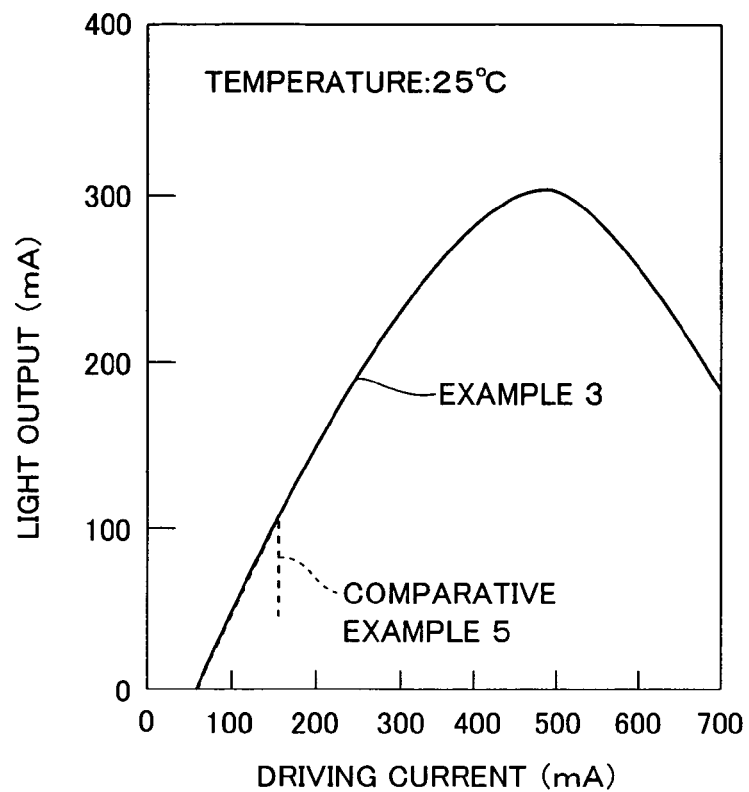

Referring to FIG. 14, it has been proved that the COD level was improved in the sample G according to Example 3 corresponding to the first embodiment prepared by forming the window structure on the emission end surface portions as compared with the sample H according to comparative example 5 having no window structure on the emission end surface portions. More specifically, the diode was not damaged in the sample G according to Example 3 also when a driving current was about 700 mA. In the sample H according to comparative example 5, on the other hand, the diode was damaged when a driving current was about 150 mA, conceivably for the following reason: In the sample G according to Example 3, it was possible to sufficiently disorder a multiple quantum well of the emission end surface portion of the active layer 4 by carrying out a window structure forming step of diffusing the impurities from the p-type cladding layer 5 into the active layer 4 on the emission end surface portion, thereby sufficiently increasing the band gap on the emission end surface portion of the active layer 4. Therefore, it was conceivably possible to prevent the emission end surface portion of the active layer 4 from absorbing light, thereby sufficiently preventing the emission end surface portion of the active layer 4 from reaching a high temperature. Consequently, it was conceivably possible to sufficiently prevent the emission end surface portion for a laser beam from thermal breakage. In the sample G according to Example 3, the light output value peaked when the driving current was about 450 mA to about 500 mA, and thereafter lowered. This is conceivably because the quantity of heat generation was increased in the diode due to the increased driving current, to reduce luminous efficiency.

Second Embodiment

Figure 15:
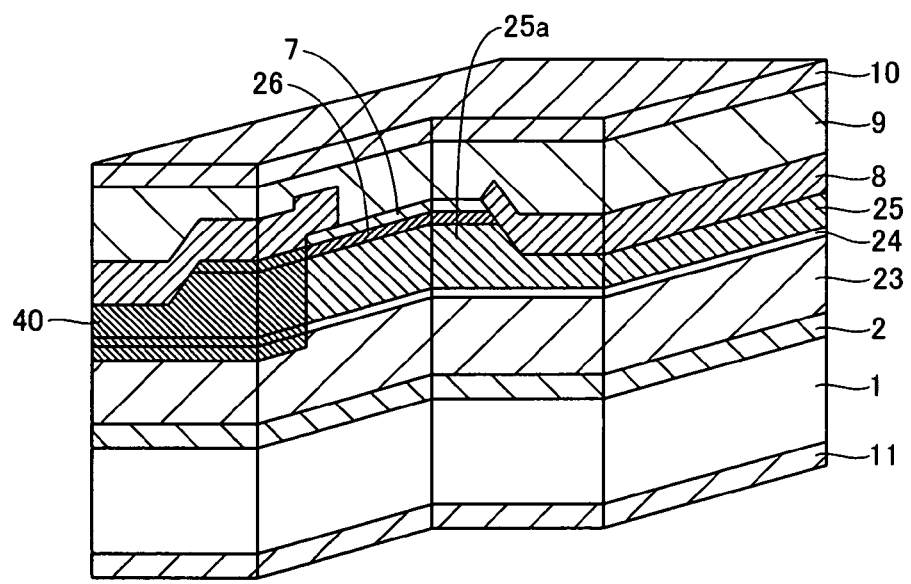
FIG. 15 is a perspective view showing the structure of an infrared semiconductor laser diode according to a second embodiment of the present invention.

Referring to FIG. 15, a second embodiment of the present invention is applied to an infrared semiconductor laser diode, dissimilarly to the aforementioned first embodiment.

In the infrared semiconductor laser diode according to the second embodiment, an active layer 24 containing Mg and Zn in prescribed impurity concentrations respectively is formed on an n-type cladding layer 23 as shown in FIG. 15, similarly to the aforementioned first embodiment. The active layer 24 has a multiple quantum well active layer formed by alternately stacking two well layers (not shown) of GaAs each having a thickness of about 4 nm and a barrier layer (not shown) of AlGaAs having a thickness of about 3 nm between two light guide layers (not shown) of AlGaAs each having a thickness of about 10 nm. The n-type cladding layer 23 is an example of the "n-type layer" in the present invention.

According to the second embodiment, a Zn diffusion region 40 containing Zn introduced as an impurity is formed on emission end surface portions of the n-type cladding layer 23, the active layer 24, a p-type cladding layer 25 having a projecting portion 25a and a p-type contact layer 26, similarly to the aforementioned first embodiment. In this Zn diffusion region 40, Zn introduced into the emission end surface portion of the p-type cladding layer 25 is diffused to extrude toward the n-type cladding layer 23 through the active layer 24. Thus, atoms constituting the well layers (not shown) and the barrier layer (not shown) of the active layer 24 are mutually diffused, to disorder the multiple quantum well layer on the emission end surface portion of the active layer 24. Thus, the band gap of the emission end surface portion of the active layer 24 is enlarged beyond those of the remaining portions, to form a window structure. The p-type cladding layer 25 is an example of the "p-type layer" in the present invention.

The remaining structure of the second embodiment is similar to that of the aforementioned first embodiment.

The remaining effects of the second embodiment are also similar to those of the aforementioned first embodiment.

A process of fabricating the infrared semiconductor laser diode according to the second embodiment of the present invention is now described with reference to FIG. 15.

According to the second embodiment, one of the two light guide layers (not shown) of AlGaAs having the thickness of about 10 nm is grown on the n-type cladding layer 23 through a step similar to that in the aforementioned first embodiment, as shown in FIG. 15. Thereafter the two well layers (not shown) of GaAs each having the thickness of about 4 nm and the barrier layer (not shown) of AlGaAs having the thickness of about 3 nm are alternately grown on this light guide layer (not shown). Then, the other one of the two light guide layers (not shown) of AlGaAs having the thickness of about 10 nm is grown on the upper well layer (not shown), thereby forming the active layer 24.

According to the second embodiment, the Zn diffusion region 40 having the window structure is formed on the emission end surface portions of the n-type cladding layer 23, the active layer 24, the p-type cladding layer 25 and the p-type contact layer 26 through a step similar to that in the aforementioned first embodiment. At this time, the multiple quantum well (MQW) structure of the active layer 24 on the Zn diffusion region 40 is disordered to increase the band gap of the active layer 24 on the Zn diffusion region 40.

The remaining fabrication process according to the second embodiment is similar to that of the aforementioned first embodiment.

A comparative experiment conducted for confirming the effects of the infrared semiconductor laser diode according to the second embodiment is now described with reference to FIG. 16.

Figure 16:
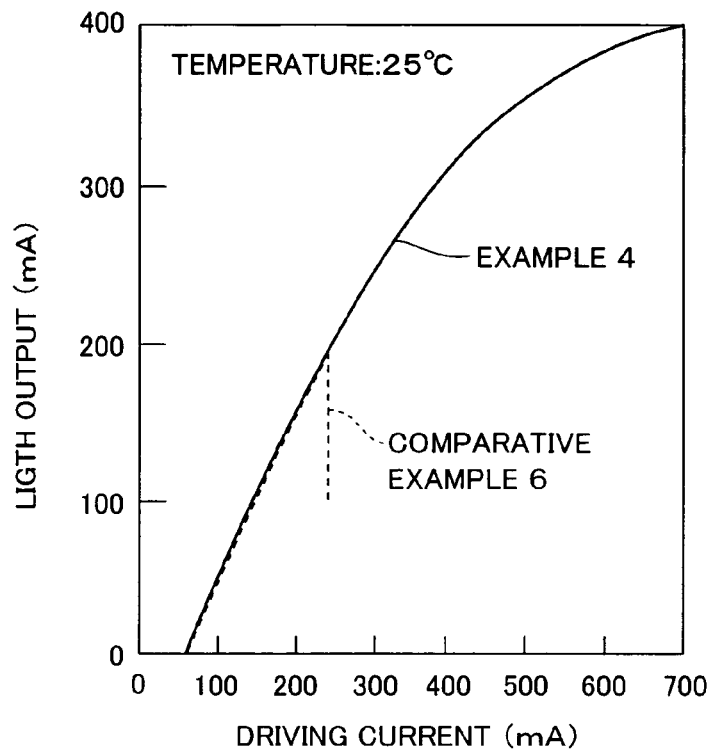
FIG. 16 is a diagram for illustrating an experiment conducted for confirming effects of the infrared semiconductor laser diode according to the second embodiment shown in FIG. 15.

Referring to FIG. 16, the comparative experiment was conducted on current-light output characteristics (I-L characteristics) with respect to presence/absence of window structures on emission end surface portions. In this comparative experiment, a sample I according to Example 4 corresponding to the second embodiment and a sample J according to comparative example 6 were prepared and subjected to evaluation of the current-light output characteristics (I-L characteristics).

The sample I according to Example 4 was prepared through the fabrication process according to the aforementioned second embodiment. In other words, the sample I according to Example 4 was prepared by forming a Zn diffusion region 40 having a window structure on emission end surface portions of an n-type cladding layer 23, an active layer 24, a p-type cladding layer 25 and a p-type contact layer 26. The sample J according to comparative example 6 was prepared by forming no Zn diffusion region having a window structure on emission end surface portions of an n-type cladding layer, an active layer, a p-type cladding layer and a p-type contact layer. The remaining conditions for preparing the sample J according to comparative 6 were similar to those for the sample I according to Example 4. The current-light output characteristics of these samples I and J were measured by continuously feeding currents thereto at a temperature of about 25° C. FIG. 16 shows the results.

Referring to FIG. 16, it has been proved that the COD level was improved in the sample I according to Example 4 corresponding to the second embodiment prepared by forming the window structure on the emission end surface portions as compared with the sample I according to comparative example 6 having no window structure on the emission end surface portions. More specifically, the diode was not damaged in the sample I according to Example 4 also when a driving current was about 700 mA. In the sample J according to comparative example 6, on the other hand, the diode was damaged when a driving current was about 250 mA, conceivably for the following reason: In the sample I according to Example 4, it was conceivably possible to sufficiently diffuse the impurities from the p-type cladding layer 25 in the active layer 24 on the emission end surface portions by carrying out a window structure forming step of diffusing the impurities from the p-type cladding layer 25 into the active layer 24 on the emission end surface portions. Thus, it was conceivably possible to sufficiently disorder a multiple quantum well of the active layer 24 on the emission end surface portion, thereby sufficiently increasing the band gap of the active layer 4 on the emission end surface portion. Therefore, it was conceivably possible to prevent the emission end surface portion of the active layer 24 from absorbing light, thereby sufficiently preventing the emission end surface portion of the active layer 24 from reaching a high temperature. Consequently, it was conceivably possible to sufficiently prevent the emission end surface portion for a laser beam from thermal breakage.

While a single semiconductor laser diode is formed on a single substrate in each of the aforementioned embodiments, the present invention is also applicable to a plurality of semiconductor laser diodes formed on a single substrate. A case of forming a plurality of semiconductor laser diodes on a single substrate is now described.

Third Embodiment

Figure 17:
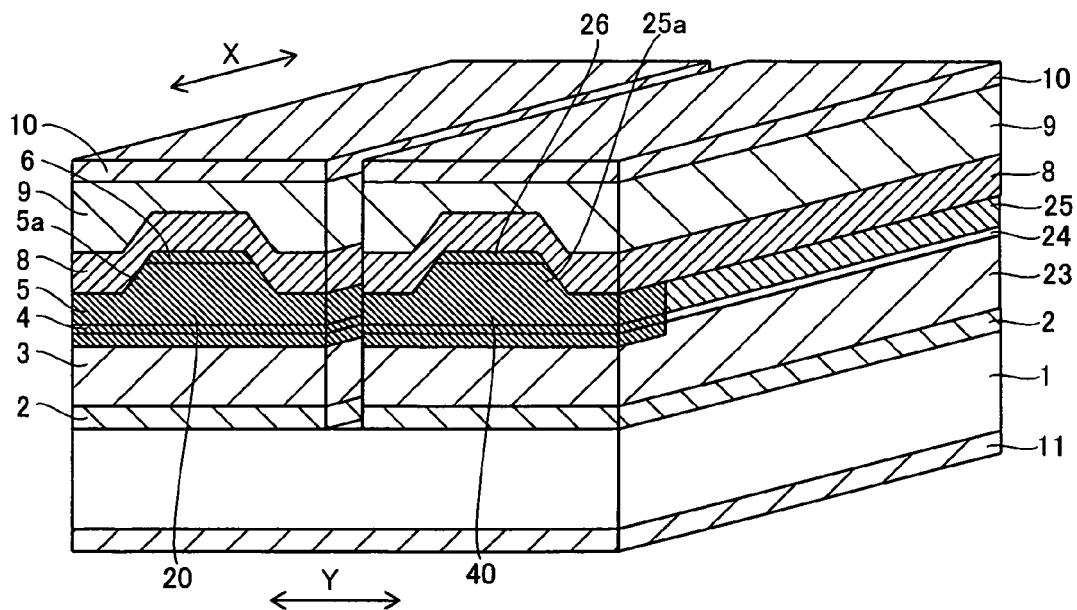
FIG. 17 is a perspective view showing the structure of a semiconductor laser diode according to a third embodiment of the present invention.

Referring to FIG. 17, a third embodiment of the present invention is applied to a double-wavelength semiconductor laser diode prepared by forming a high-output red semiconductor laser diode, employed for a DVD-R, having an oscillation wavelength of the 660 nm band and a high-output infrared semiconductor laser diode, employed for a CD-R, having an oscillation wavelength of the 780 nm band on a single GaAs substrate 1, dissimilarly to the aforementioned first and second embodiments.

In the two-wavelength semiconductor laser diode according to the third embodiment, a red semiconductor laser diode similar to that according to the aforementioned first embodiment and an infrared semiconductor laser diode similar to that according to the aforementioned second embodiment are formed on the single GaAs substrate 1, as shown in FIG. 17. More specifically, a red semiconductor laser diode portion (a buffer layer 2, an n-type cladding layer 3, an active layer 4, a p-type cladding layer 5, a p-type contact layer 6, a lower cap layer 7, a current blocking layer 8, an upper cap layer 9 and a p-side electrode 10) constituting the red semiconductor laser diode and an infrared semiconductor laser diode portion (a buffer layer 2, an n-type cladding layer 23, an active layer 24, a p-type cladding layer 25, a p-type contact layer 26, a lower cap layer 7, a current blocking layer 8, an upper cap layer 9 and a p-side electrode 10) constituting the infrared semiconductor laser diode are so formed as to extend along arrow X at a prescribed interval in a direction Y. The GaAs substrate 1 is an example of the "substrate" in the present invention. The red semiconductor laser diode portion is an example of the "first laser diode portion" in the present invention, and the infrared semiconductor laser diode portion is an example of the "second laser diode portion" in the present invention. The n-type cladding layers 3 and 23 are examples of the "first n-type layer" and the "second n-type layer" in the present invention respectively. The active layers 4 and 24 are examples of the "first active layer" and the "second active layer" in the present invention respectively. The p-type cladding layers 5 and 25 are examples of the "first p-type layer" and the "second p-type layer" in the present invention respectively.

The remaining structure of the third embodiment is similar to those of the aforementioned first and second embodiments.

A process of fabricating the double-wavelength semiconductor laser diode according to the third embodiment of the present invention is now described with reference to FIGS. 17 to 29.

Figure 18:
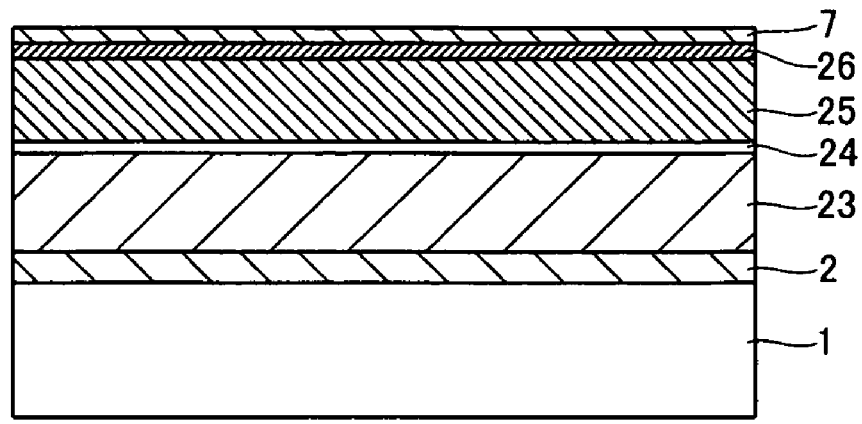
FIGS. 18 to 29 are diagrams for illustrating a process of fabricating the semiconductor laser diode according to the third embodiment shown in FIG. 17.

As shown in FIG. 18, the buffer layer 2, the n-type cladding layer 23, the active layer 24, the p-type cladding layer 25, the p-type contact layer 26 and the lower cap layer 7 are successively grown on the GaAs substrate 1 through steps similar to those in the aforementioned second embodiment.

Figure 19:
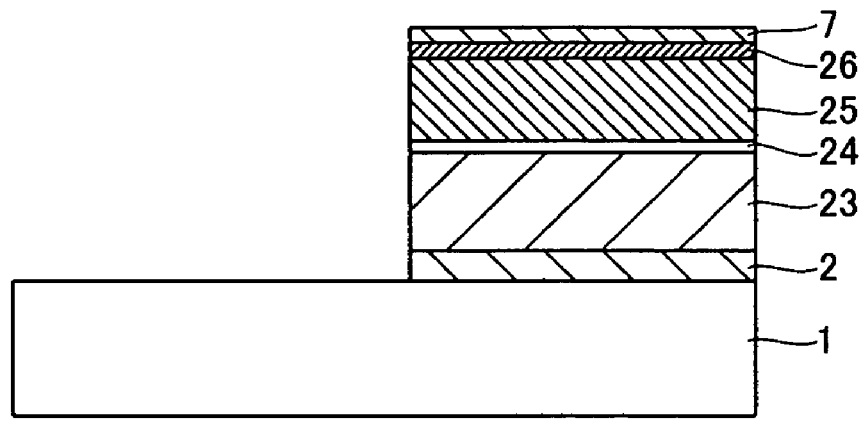

According to the third embodiment, portions of the buffer layer 2, the n-type cladding layer 23, the active layer 24, the p-type cladding layer 25, the p-type contact layer 26 and the lower cap layer 7 other than those corresponding to the infrared semiconductor laser diode portion are removed by photolithography and etching, as shown in FIG. 19.

Figure 20:
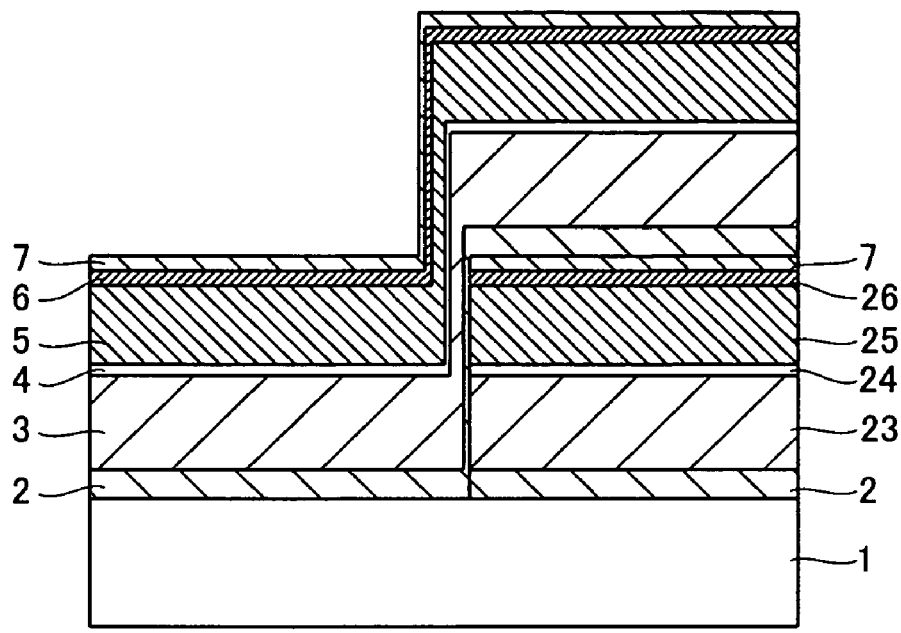

As shown in FIG. 20, the buffer layer 2, the n-type cladding layer 3, the active layer 4, the p-type cladding layer 5, the p-type contact layer 6 and the lower cap layer 7 are successively grown on the GaAs substrate 1 through steps similar to those in the aforementioned first embodiment.

Figure 21:
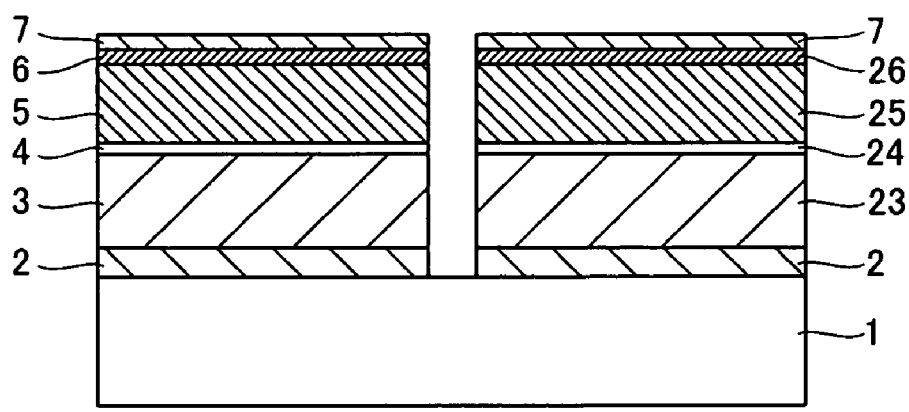

According to the third embodiment, portions of the buffer layer 2, the n-type cladding layer 3, the active layer 4, the p-type cladding layer 5, the p-type contact layer 6 and the lower cap layer 7 other than those corresponding to the red semiconductor laser diode portion are removed by photolithography and etching, as shown in FIG. 21.

Figure 22:
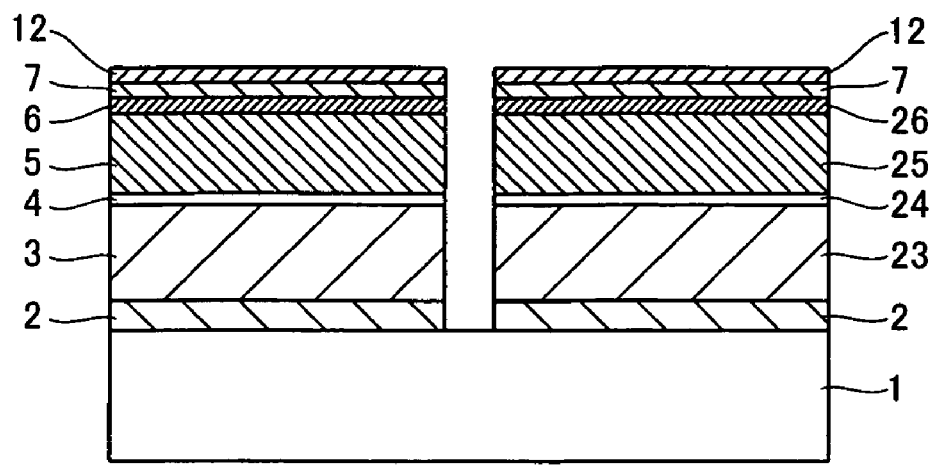

According to the third embodiment, SiN layers 12 are simultaneously formed on prescribed regions (regions other than emission end surface portions) of the lower cap layers 7 of the red and infrared semiconductor laser diode portions respectively through steps similar to those in the aforementioned first and second embodiments, as shown in FIG. 22. Thereafter the SiN layers 12 are employed as masks for simultaneously etching the lower cap layers 7 of the red and infrared semiconductor laser diode portions, thereby removing the emission end surface portions of the lower cap layers 7.

Figure 23:
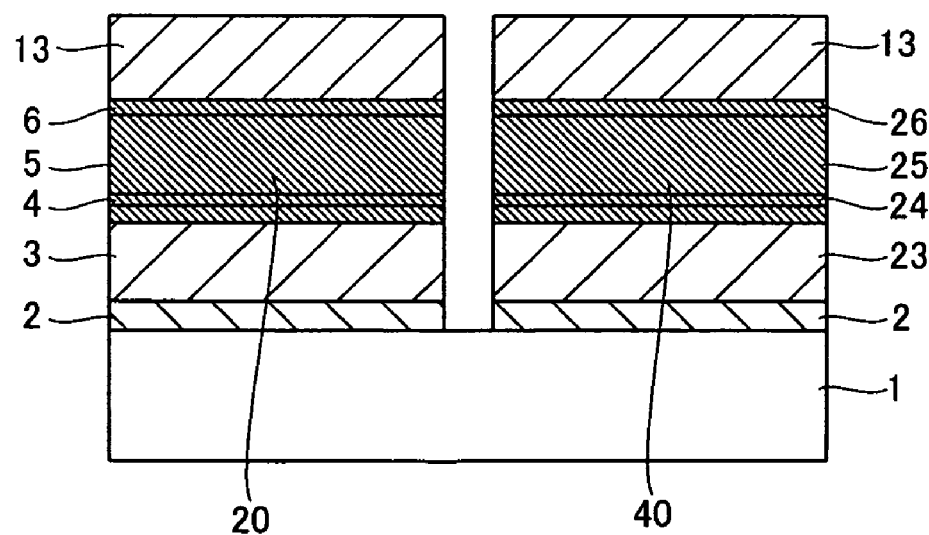

According to the third embodiment, diffusion sources 13 of ZnO are simultaneously grown on the etched portions (emission end surface portions) of the lower cap layers 7 (see FIG. 22) of the red and infrared semiconductor laser diode portions through steps similar to those in the aforementioned first and second embodiments, as shown in FIG. 23. Thereafter heat treatment is performed at a temperature of about 500° C. for about 20 minutes, thereby simultaneously diffusing Zn contained in emission end surface portions of the p-type cladding layers 5 and 25 of the red and infrared semiconductor laser diode portions up to the n-type cladding layers 3 and 23 through the active layers 4 and 24 respectively. Thus, Zn diffusion regions 20 and 40 having window structures are simultaneously formed on the emission end surface portions of the red and infrared semiconductor laser diode portions respectively.

Figure 24:
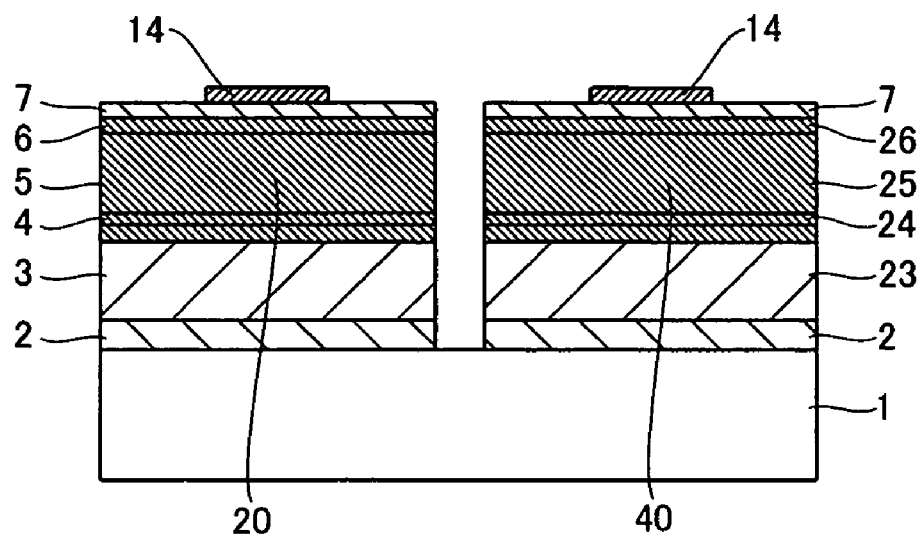

As shown in FIG. 24, the diffusion sources 13 (see FIG. 23) and the SiN layers 12 (see FIG. 22) are removed and SiO$_2$ layers 14 extending in a prescribed direction (along arrow X in FIG. 17) are simultaneously formed on prescribed regions of the red and infrared semiconductor laser diode portions respectively.

Figure 25:
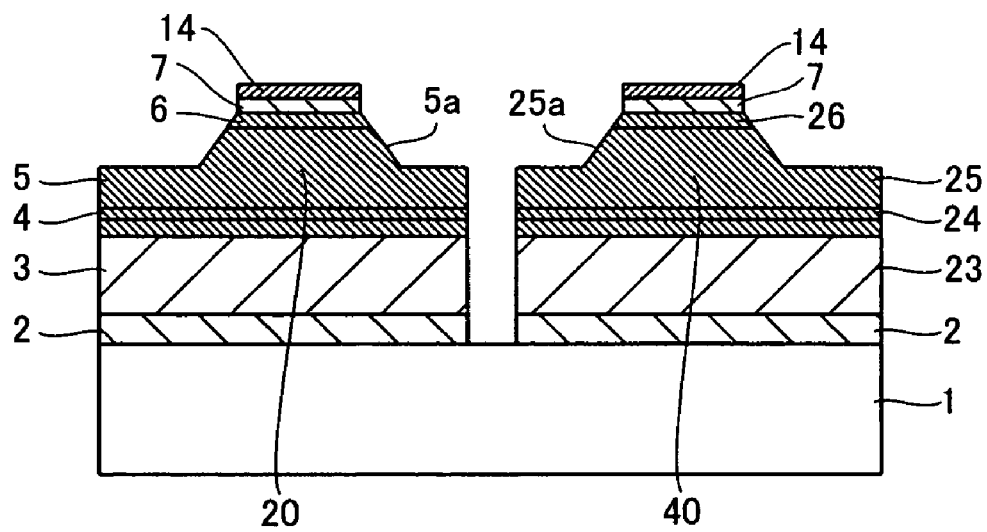
Figure 26:
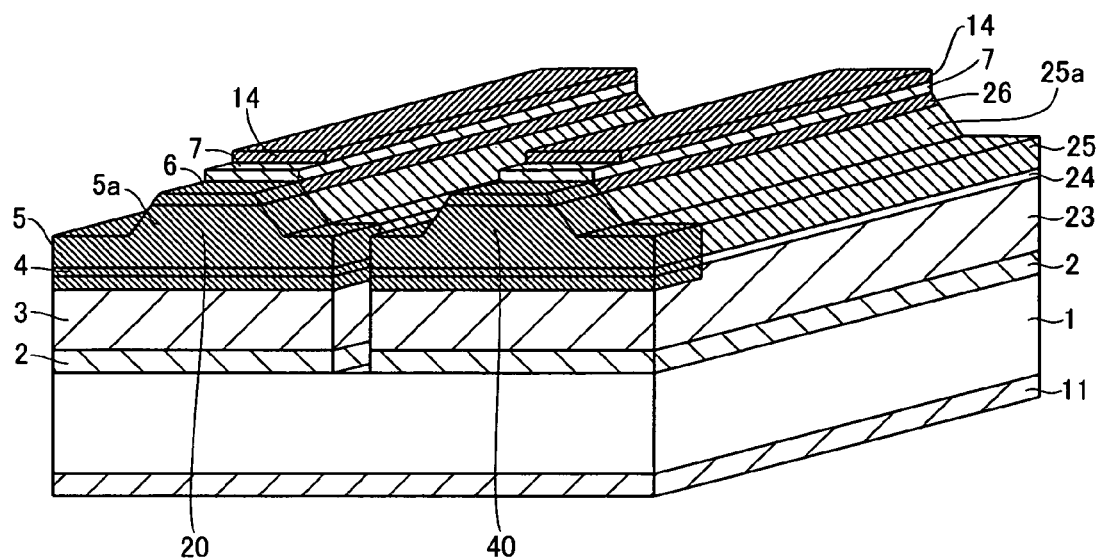

As shown in FIG. 25, the SiO$_2$ layers 14 are employed as masks for simultaneously etching the lower cap layers 7, the p-type contact layers 6 and 26 and the p-type cladding layers 5 and 25 of the red and infrared semiconductor laser diode portions up to portions of prescribed thicknesses from the upper surfaces respectively through steps similar to those in the aforementioned first and second embodiments. Thus, projecting portions 5a and 25a of the p-type cladding layers 5 and 25 and the p-type contact layers 6 and 26 constitute striped (slender) ridge portions extending in the prescribed direction (along arrow X in FIG. 17). Thereafter prescribed regions of the SiO$_2$ layers 14 are removed as shown in FIG. 26.

Figure 27:
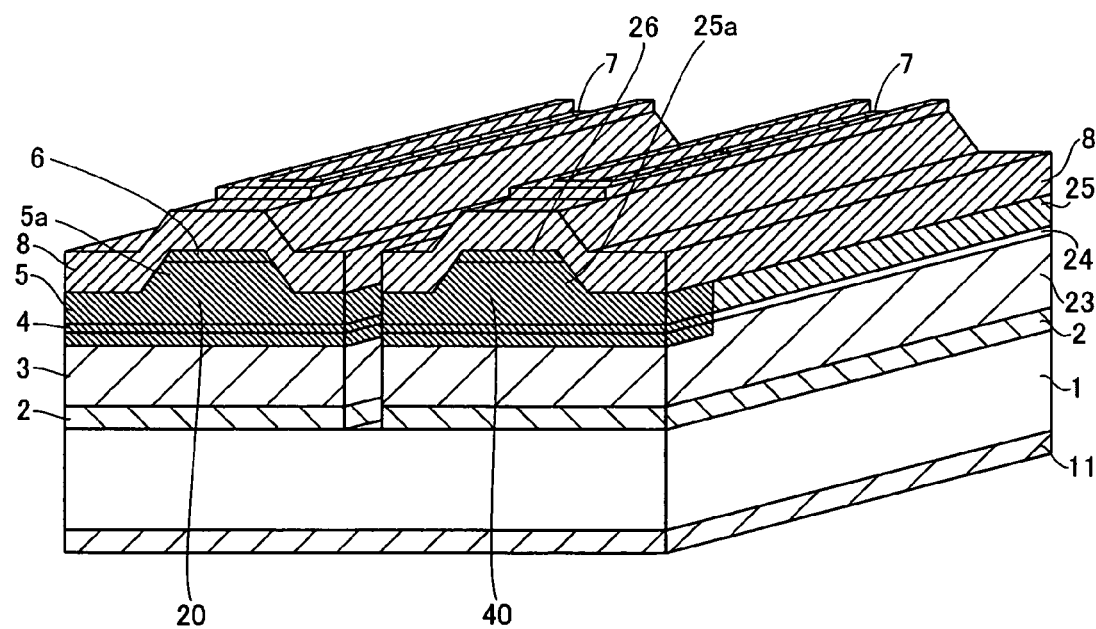

As shown in FIG. 27, the current blocking layers 8 consisting of n-type AlInP layers having a thickness of about 0.4 μm and n-type GaAs layers having a thickness of about 0.4 μm are grown to cover the upper surfaces of the p-type cladding layers 5 and 25, the side surfaces of the projecting portions 5a and 25a of the p-type cladding layers 5 and 25, the upper and side surfaces of the p-type contact layers 6 and 26, the upper and side surfaces of the lower cap layers 7 and the side surfaces of the SiO$_2$ layers 14 (see FIG. 26) through steps similar to those in the aforementioned first and second embodiments. Thereafter the SiO$_2$ layers 14 (see FIG. 26) are removed.

Figure 28:
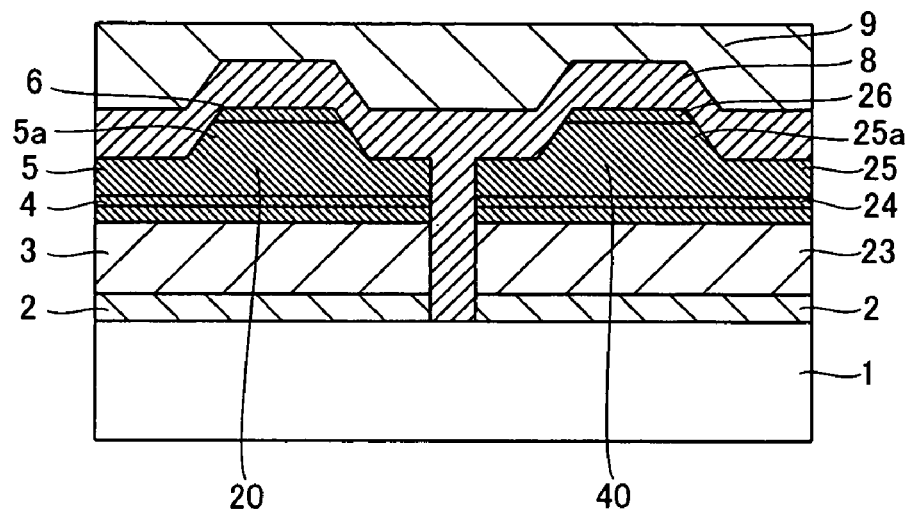

As shown in FIG. 28, the upper cap layer 9 of p-type GaAs doped with Zn having a thickness of about 1.0 μm is grown to cover the overall surfaces of the red and infrared semiconductor laser diode portions, through a step similar to those in the aforementioned first and second embodiments.

Figure 29:
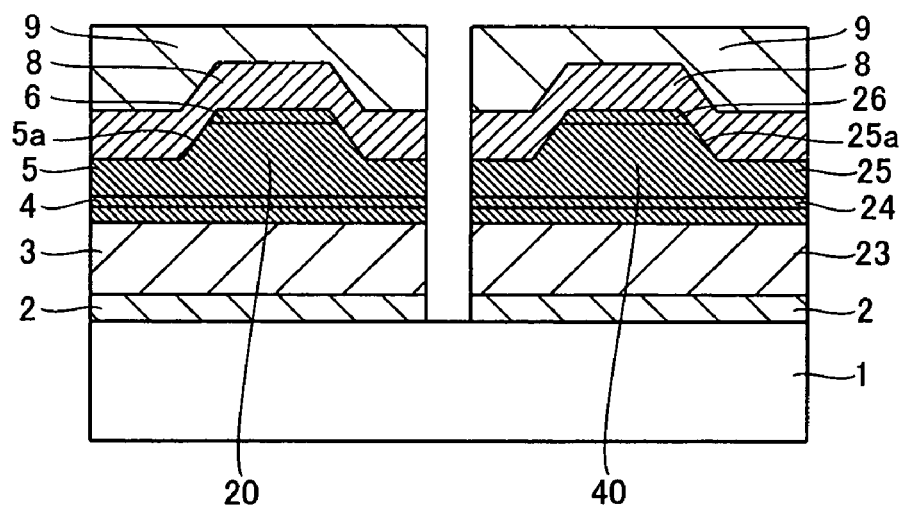

According to the third embodiment, portions of the current blocking layers 8 and the upper cap layer 9 located between the red and infrared semiconductor laser diode portions are removed by etching, as shown in n FIG. 29. Thus, the red and infrared semiconductor laser diode portions are separated from each other on the GaAs substrate 1.

As shown in FIG. 17, the p-side electrodes 10 consisting of Cr layers and Au layers are simultaneously formed on the upper cap layers 9 of the red and infrared semiconductor laser diode portions respectively through steps similar to those in the aforementioned first and second embodiments. Thus, the red semiconductor laser diode portion (2 to 10) and the infrared semiconductor laser diode portion (2, 23 to 26 and 7 to 10) are formed to constitute the red semiconductor laser diode and the infrared semiconductor laser diode respectively.

The remaining fabrication process of the third embodiment is similar to those of the aforementioned first and second embodiments.

According to the third embodiment, as hereinabove described, the fabrication process for the double-wavelength semiconductor laser diode can be simplified and the fabrication time can be reduced by simultaneously forming the Zn diffusion regions 20 and 40 having the window structures on the emission end surface portions of the active layers 4 and 24 respectively.

The remaining effects of the third embodiment are similar to those of the aforementioned first and second embodiments.

Although the present invention has been described and illustrated in detail, it is clearly understood that the same is by way of illustration and example only and is not to be taken by way of limitation, the spirit and scope of the present invention being limited only by the terms of the appended claims.

For example, while the aforementioned first to third embodiments are applied to the AlGaInP red semiconductor laser diodes and the AlGaAs infrared semiconductor laser diodes employed as exemplary semiconductor laser diodes, the present invention is not restricted to this but is also applicable to a GaN-based blue-violet semiconductor laser diode. In a case of forming a plurality of semiconductor laser diodes on a single substrate, red, infrared and blue-violet semiconductor laser diodes may be combined with each other. In this case, a triple-wavelength semiconductor laser diode can also be obtained with the red, infrared and blue-violet semiconductor diodes.

While the upper cap layer is provided on the lower cap layer and the current blocking layer and the p-side electrode is provided on the upper cap layer in each of the aforementioned first to third embodiments, the present invention is not restricted to this but the p-side electrode may alternatively be provided directly on the lower cap layer and the current blocking layer with no upper cap layer provided on the lower cap layer and the current blocking layer.

Figure 30:
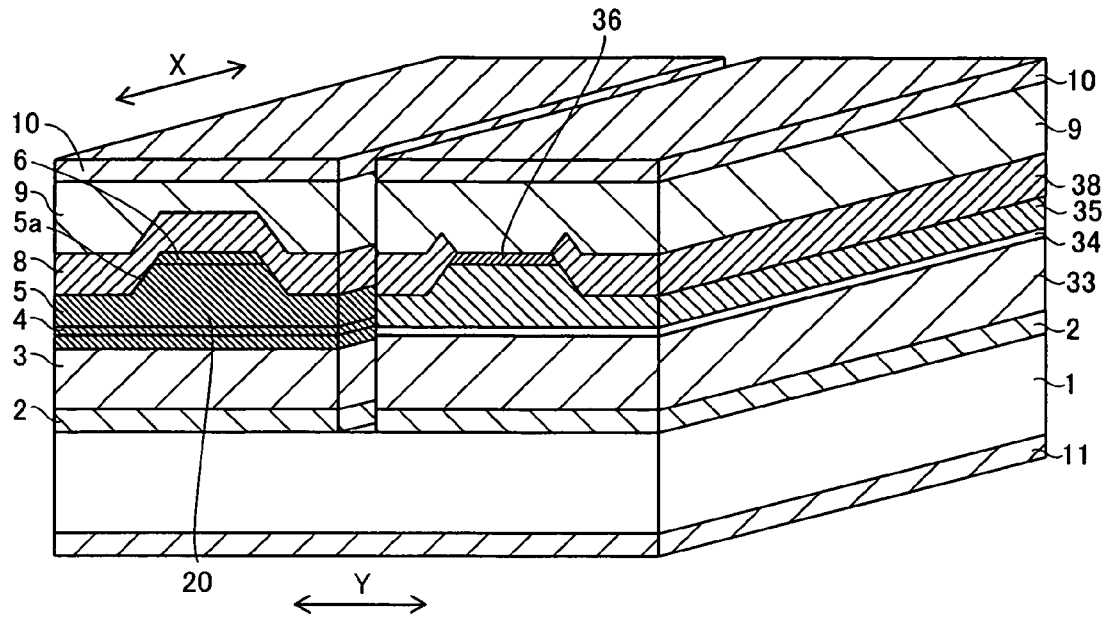
FIG. 30 is a perspective view showing the structure of a semiconductor laser diode according to a modification of the third embodiment.
Figure 31:
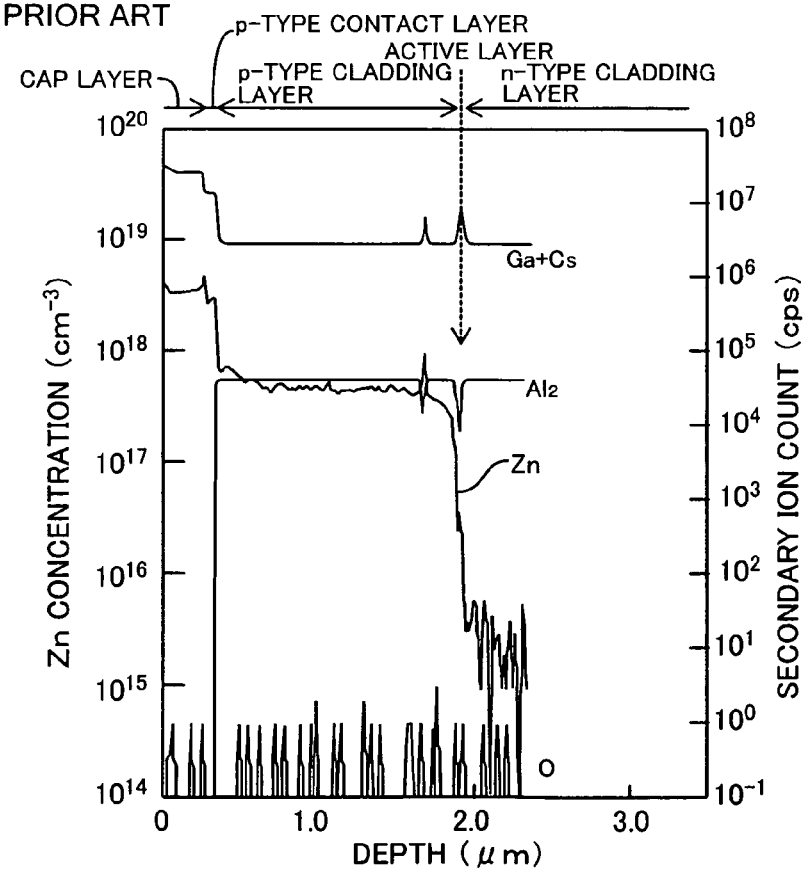
FIG. 31 illustrates a Zn concentration profile before Zn diffusion on an emission end surface portion of an exemplary conventional semiconductor laser diode.
Figure 32:
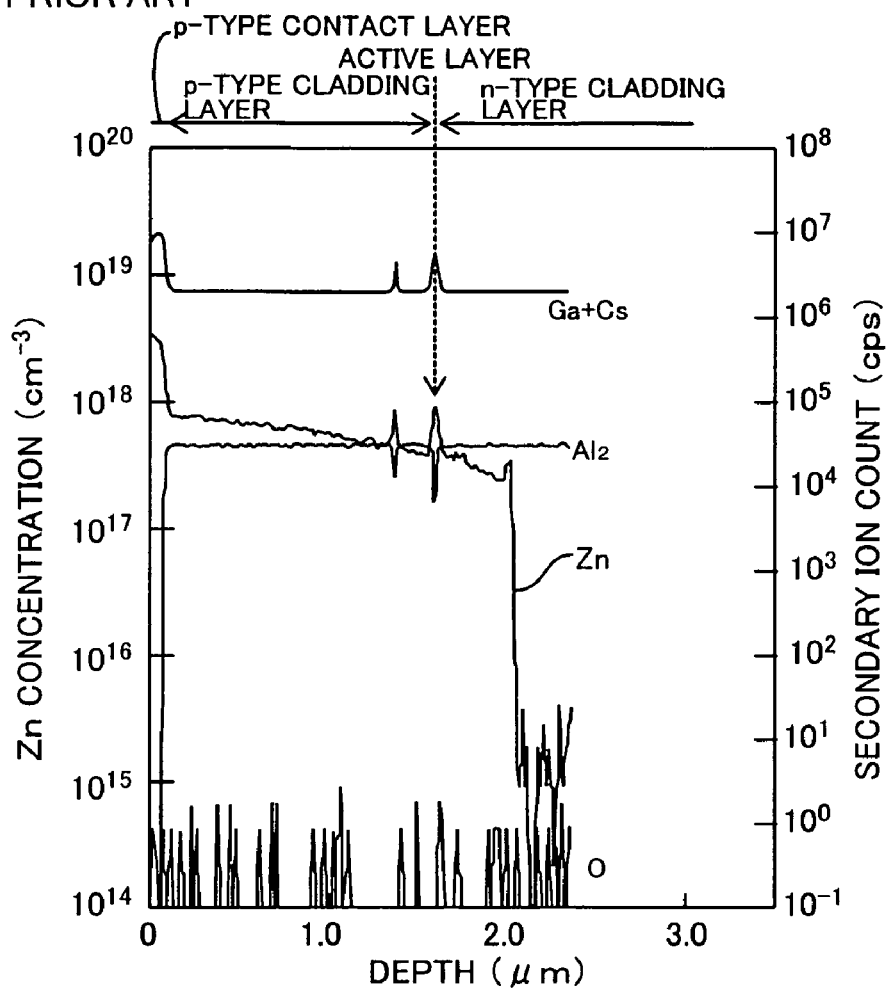
FIG. 32 illustrates a Zn concentration profile after the Zn diffusion on the emission end surface portion of the exemplary conventional semiconductor laser diode.

While the window structures as well as end current non-injection structures are formed on both emission end surface portions of the red and infrared semiconductor laser diode portions respectively in the aforementioned third embodiment, the present invention is not restricted to this but a window structure as well as an end current non-injection structure may alternatively be formed on an emission end surface portion of a red semiconductor laser diode portion (2 to 10) with neither window structure nor end current non-injection structure provided on an emission end surface portion of an infrared semiconductor laser diode portion (2, 33 to 36, 7, 38, 9 and 10) as in a modification of the third embodiment shown in FIG. 30. In this case, an active layer 34 of the infrared semiconductor laser diode portion may have a multiple quantum well active layer formed by alternately stacking three well layers (not shown) of GaAs each having a thickness of about 4 nm and two barrier layers (not shown) of AlGaAs each having a thickness of about 8 nm between two light guide layers (not shown) of AlGaAs each having a thickness of about 20 nm. Further, an n-type cladding layer 33 may be formed by an n-type AlGaAs layer having a thickness of about 2.5 μm and a p-type cladding layer 35 may be formed by a p-type AlGaAs layer having a thickness of about 1.5 μm in the infrared semiconductor laser diode portion. In addition, a current blocking layer 38 of the infrared semiconductor laser diode portion may be formed by an n-type AlGaAs layer having a thickness of about 0.6 μm and an n-type GaAs layer having a thickness of about 0.3 μm.

What is claimed is:

1. A semiconductor laser diode comprising:
   an active layer having a window structure in a laser beam emission end surface portion; and
   a p-type layer, formed on the surface of said active layer, containing Mg and Zn as impurities, wherein
   the Mg and said Zn are introduced into at least a region of said active layer other than said emission end surface portion; and,
   the impurity concentration of said Zn contained in a region of said p-type layer other than said emission end surface portion is larger than the impurity concentration of said Mg contained in said region of said p-type layer other than said emission end surface portion.

2. The semiconductor laser diode according to claim 1, wherein
   said Mg and said Zn are introduced into at least said emission end surface portion of said active layer, and
   the impurity concentration of said Zn introduced into said emission end surface portion of said active layer is larger than the impurity concentration of said Mg introduced into said emission end surface portion of said active layer.

3. The semiconductor laser diode according to claim 1, further comprising an n-type layer so formed on the surface of said active layer as to hold said active layer between the same and said p-type layer, wherein
   said window structure is formed by diffusing said Zn introduced into said emission end surface portion of said p-type layer up to said n-type layer through said active layer.

4. The semiconductor laser diode according to claim 1, wherein
   said Zn is introduced into said emission end surface portion of said active layer and a region of said active layer other than said emission end surface portion, and
   the impurity concentration of said Zn in said emission end surface portion of said active layer is larger than the impurity concentration of said Zn in said region of said active layer other than said emission end surface portion.

5. The semiconductor laser diode according to claim 1, further comprising:
   a first laser diode portion including said active layer having said window structure and said p-type layer containing Mg and Zn,
   a second laser diode portion, and
   a single substrate formed with said first laser diode portion and said second laser diode portion on the surface thereof.

6. The semiconductor laser diode according to claim 5, wherein
   said second laser diode portion also includes an active layer having a window structure and a p-type layer containing Mg and Zn.

7. The semiconductor laser diode according to claim 6, wherein
   said first laser diode portion constitutes a red semiconductor laser diode, and
   said second laser diode portion constitutes an infrared semiconductor laser diode.

8. The semiconductor laser diode according to claim 5, wherein
   said first laser diode portion constitutes either a red semiconductor laser diode or an infrared semiconductor laser diode.

9. The semiconductor laser diode according to claim 1, wherein
   the impurity concentration of said Zn in said emission end surface portion of said p-type layer is larger than the impurity concentration of said Zn in said region of said p-type layer other than said emission end surface portion.

10. The semiconductor laser diode according to claim 1, wherein
    the impurity concentration of said Zn and the impurity concentration of said Mg in said region of said p-type layer other than said emission end surface portion, is larger than the impurity concentration of said Zn and the impurity concentration of said Mg in a region of said active layer other than said emission end surface portion, respectively.

11. The semiconductor laser diode according to claim 1, wherein
    the total of the impurity concentration of said Zn and the impurity concentration of said Mg in said region of said p-type layer, other than said emission end surface portion, is smaller than $8.5 \times 10^{17}$ cm$^{-3}$.

* * * * *